United States Patent
Maehata

(10) Patent No.: US 9,515,674 B2
(45) Date of Patent: *Dec. 6, 2016

(54) SIGNAL CONVERSION METHOD, SIGNAL TRANSMISSION METHOD, SIGNAL CONVERSION DEVICE, AND TRANSMITTER

(71) Applicant: SUMITOMO ELECTRIC INDUSTRIES, LTD., Osaka-shi, Osaka (JP)

(72) Inventor: Takashi Maehata, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/849,150

(22) Filed: Sep. 9, 2015

(65) Prior Publication Data

US 2016/0118997 A1    Apr. 28, 2016

Related U.S. Application Data

(63) Continuation of application No. 14/457,539, filed on Aug. 12, 2014, now Pat. No. 9,166,616, which is a continuation of application No. PCT/JP2013/053993, filed on Feb. 19, 2013.

(30) Foreign Application Priority Data

Feb. 20, 2012 (JP) ................. 2012-034196
Jun. 5, 2012 (JP) ................. 2012-127643
Jun. 5, 2012 (JP) ................. 2012-127722
Aug. 24, 2012 (JP) ................. 2012-185371

(51) Int. Cl.
*H03M 3/00* (2006.01)
*H04B 1/04* (2006.01)
(Continued)

(52) U.S. Cl.
CPC ............ *H03M 3/352* (2013.01); *H03K 17/16* (2013.01); *H03M 3/502* (2013.01); *H04B 1/0475* (2013.01); *H03K 5/04* (2013.01)

(58) Field of Classification Search
CPC ............................. H03K 5/04; H04B 1/0475
See application file for complete search history.

(56) References Cited

U.S. PATENT DOCUMENTS

| 4,972,436 A | 11/1990 | Halim et al. |
| 5,028,925 A | 7/1991 | Ferry et al. |

(Continued)

FOREIGN PATENT DOCUMENTS

| JP | H03-46824 A | 2/1991 |
| JP | H06-132829 A | 5/1994 |

(Continued)

OTHER PUBLICATIONS

Joon Hyung Kim, et al., "60% High-Efficiency 3G LTE Power Amplifier with Three-level Delta Sigma Modulation Assisted by Dual Supply Injection," Microwave Symposium Digest (MTT), 2011 IEEE MTT-S International, Jun. 2011.

(Continued)

*Primary Examiner* — Howard Williams
(74) *Attorney, Agent, or Firm* — Drinker Biddle & Reath LLP

(57) ABSTRACT

A signal conversion method including converting an input signal into a 1-bit pulse train representing an analog signal is provided. The 1-bit pulse train has a pulse rising waveform $f_{rise}$ and a pulse falling waveform $f_{fall}$. The pulse rising waveform $f_{rise}$ includes a first distortion component with respect to an ideal pulse rising waveform, and the pulse falling waveform $f_{fall}$ includes a second distortion component with respect to an ideal pulse falling waveform. The first distortion component and the second distortion component are substantially line-symmetric with respect to a time axis.

6 Claims, 23 Drawing Sheets

(51) Int. Cl.
   *H03K 17/16* (2006.01)
   *H03K 5/04* (2006.01)

(56) References Cited

U.S. PATENT DOCUMENTS

| | | | |
|---|---|---|---|
| 5,339,078 | A | 8/1994 | Vernon |
| 5,418,478 | A | 5/1995 | Van Brunt et al. |
| 5,444,410 | A | 8/1995 | Polhemus |
| 5,461,641 | A | 10/1995 | Abbiate et al. |
| 5,736,950 | A | 4/1998 | Harris et al. |
| 6,885,330 | B2 | 4/2005 | Trotter et al. |
| 7,098,829 | B2 | 8/2006 | Westra |
| 9,166,616 | B2 * | 10/2015 | Maehata ............. H03K 17/16 |
| 2004/0036530 | A1 | 2/2004 | Matsuura et al. |
| 2007/0139070 | A1 | 6/2007 | Tian et al. |

FOREIGN PATENT DOCUMENTS

| | | |
|---|---|---|
| JP | H10-22830 A | 1/1995 |
| JP | H08-307286 A | 11/1996 |
| JP | 2003-298435 A | 10/2003 |
| JP | 2004-048703 A | 2/2004 |
| JP | 2006-303681 A | 11/2006 |

OTHER PUBLICATIONS

Woo-Young Kim, et al., "An Efficient Voltage-Mode Class-D Power Amplifier for Digital Transmitters with Delta-Sigma Modulation," Microwave Symposium Digest (MTT), 2011 IEEE MTT-S International, Jun. 2011.

Takashi Maehata, et al., "Development of 1-Bit Digital Radio Frequency Transmitter," SEI Technical Review, No. 182, Jan. 25, 2013 (Jan. 25, 2013), pp. 90-94.

Takashi Maehata, et al., "High ACLR 1-bit Direct Radio Frequency Converter Using Symmetric Waveform," Proceedings of the 42nd European Microwave Conference, Oct. 2012, pp. 1051-1054.

Takashi Maehata, et al., "Analysis on Base Band Waveform and ACLR in BP-DSM," 2012 Nen The Institute of Electronics, Information and Communication Engineers Sogo Taikai Koen Ronbunshu, Mar. 6, 2012 (Mar. 6, 2012), Electronics 1, p. 56.

Richard Schreier, et al. (translated by Takao Waho and Akira Yasuda), "Understanding Delta-Sigma Data Converters," Maruzen Co., Ltd., 2007, pp. 1-17.

Robert Sobot et al., Tunable Center Frequency Continuous Time Bandpass Δ Σ Modulators for Wireless transceivers, Vehicular Technology Conference, 2004, VTC2004—Fall, 2004 IEEE 60th, Sep. 2004, vol. 7, pp. 4956-4960.

Sung-Rok Yoon et al., All-Digital Transmitter Architecture based on Bandpass Delta-Sigma Modulator, Communications and Information Technology, 2009, ISCIT 2009, 9th International Symposium in Sep. 2009, pp. 703-706.

Tsai-Pi Hung et al., Design of H-Bridge Class-D Power Amplifiers for Digital Pulse Modulation Transmitters, IEEE Transactions on Microwave Theory and Techniques, Dec. 2007, vol. 55, No. 12, pp. 2845-2855.

* cited by examiner

Eye pattern

Sout(t)

Sideal(t)

fsymm(t)

fasym(t)

Eye pattern

Sout(t)

SIdeal(t)

fsymm(t)

fasym(t)

SIGNAL CONVERSION METHOD, SIGNAL TRANSMISSION METHOD, SIGNAL CONVERSION DEVICE, AND TRANSMITTER

This is a continuation application of copending application Ser. No. 14/457,539, having a filing date of Aug. 12, 2014, which is a continuation application under 37 C.F.R §1.53(b) of prior International Application No. PCJ/JP2013/053993, having a filing date of Feb. 19, 2013. The copending application Ser. No. 14/457,539 is incorporated by reference herein in its entirety.

TECHNICAL FIELD

The present invention relates to signal conversion methods, signal transmission methods, signal conversion devices, and transmitters.

BACKGROUND ART

Delta-sigma modulation is an example of a technique of generating a 1-bit pulse train representing an analog waveform (refer to Non-Patent Literature 1).

Delta-sigma modulation is a kind of oversampling modulation. A delta-sigma modulator is configured to include a loop filter and a quantizer. The quantizer can output a 1-bit pulse train as a quantized signal.

The 1-bit pulse train output from the delta-sigma modulator is restored to the original analog waveform by simply being passed through an analog filter. In other words, the 1-bit pulse train output from the delta-sigma modulator is a digital signal, but represents an analog waveform, and therefore, has properties of both a digital signal and an analog signal.

CITATION LIST

Non Patent Literature

NON PATENT LITERATURE 1: Takao Waho and Akira Yasuda (translation supervisors) (Original authors: Richard Schreier, Gabor C. Temes), "Understanding Delta-Sigma Data Converters", Maruzen Co., Ltd., 2007, pp. 1-17

NON PATENT LITERATURE 2: Joon Hyung Kim, Sung Jun Lee, Jae Ho Jung, and Chul Soon Park, "60% High-Efficiency 3G LTE Power Amplifier with Three-level Delta Sigma Modulation Assisted By Dual Supply Injection", Microwave Symposium Digest (MTT), 2011 IEEE MTT-S International, June 2011

NON PATENT LITERATURE 3: Woo-Young Kim, J. Rode, A. Scuderi, Hyuk-Su Son, Chul Soon Park, and Peter. M. Asbeck, "An Efficient Voltage-Mode Class-D Power Amplifier for Digital Transmitters with Delta-Sigma Modulation", Microwave Symposium Digest (MTT), 2011 IEEE MTT-S International, June 2011

SUMMARY OF INVENTION

Technical Problem

Non-Patent Literatures 2 and 3 each disclose that an adjacent channel leakage power ratio (ACLR) of a signal output from a delta-sigma modulator is 30 [dB] and 43 [dB], respectively.

For an analog waveform, reduction in adjacent channel leakage power is often desired. The adjacent channel leakage power is a power leaking outside an operating frequency band. The lower the adjacent channel leakage power is, the higher the ACLR is.

As described above, the 1-bit pulse train output from the delta-sigma modulator is a digital signal, but represents an analog waveform.

Accordingly, the 1-bit pulse train output from the delta-sigma modulator is desired to have low adjacent channel leakage power of the 1-bit pulse train. In other words, the 1-bit pulse train output from the delta-sigma modulator is desired to have a high ACLR of the 1-bit pulse train.

However, Non-Patent Literatures 2 and 3 do not describe the reason why the above-mentioned low ACLRs are obtained.

The inventor of the present invention made a hypothesis that a pulse waveform has an influence on an ACLR, and executed numerical simulations. As a result, the inventor confirmed that his hypothesis is right, that is, a pulse waveform has an influence on an ACLR.

The present invention is based on a new knowledge that a pulse waveform has an influence on signal characteristics, such as an ACLR, of an analog signal. The present invention has an object to improve signal characteristics of an analog signal represented by a pulse.

Solution to Problem (1) A pulse waveform and signal characteristics of an analog signal represented by the pulse waveform have never been considered. Generally, it is important for a digital signal to represent "High" and "Low". Therefore, a pulse of a digital signal needs to have a stable magnitude in the vicinity of the center of the pulse in the time axis direction, and rising and falling of the pulse are not very important.

However, the inventor of the present invention considered that, for a pulse also having a property of an analog signal, rising and falling of the pulse must be important.

That is, the inventor considered that there is a relationship between a pulse waveform and degradation of performance, and clarified the relationship through simulations. As a result, the inventor discovered that asymmetry of a rising waveform and a falling wave causes degradation of signal characteristics of an analog signal.

That is, an aspect of the present invention is a signal conversion method including converting an input signal into a 1-bit pulse train that represents an analog signal. The 1-bit pulse train has a pulse rising waveform and a pulse falling waveform. The pulse rising waveform includes a first distortion component with respect to an ideal pulse rising waveform, and the pulse falling waveform includes a second distortion component with respect to an ideal pulse falling waveform. The first distortion component and the second distortion component are substantially line-symmetric with respect to a time axis.

Since the first distortion component of the rising waveform and the second distortion component of the falling waveform are substantially line-symmetric with respect to the time axis, degradation of signal characteristics can be prevented.

(2) Preferably, line-asymmetry of the first distortion component and the second distortion component is suppressed to make the first distortion component and the second distortion component substantially line-symmetric with respect to the time axis. In this case, even when there is a factor that causes line-asymmetry, such a factor can be suppressed.

(3) The factor that causes line-asymmetry of the first distortion component and the second distortion component may include a factor inside a converter that converts an input signal into a 1-bit pulse train representing an analog signal.

(4) The factor that causes line-asymmetry of the first distortion component and the second distortion component may include a factor outside the converter that converts an input signal into a 1-bit pulse train representing an analog signal.

(5) Preferably, the input signal is input to a converter that performs delta-sigma modulation, and the 1-bit pulse train is output from the converter. In this case, the 1-bit pulse train becomes a 1-bit pulse train as a delta-sigma modulated signal.

(6) Preferably, the input signal is an RF signal. In this case the RF signal is represented by the 1-bit pulse train.

(7) Another aspect of the present invention is a signal conversion method including converting an input signal into a 1-bit pulse train that represents an analog signal. The 1-bit pulse train has a pulse rising waveform and a pulse falling waveform. The pulse rising waveform includes a first distortion component with respect to an ideal pulse rising waveform, and the pulse falling waveform includes a second distortion component with respect to an ideal pulse falling waveform. The method further includes suppressing line-asymmetry of the first distortion component and the second distortion component.

According to the present invention, even when there is a factor that causes line-asymmetry, such a factor can be suppressed.

(8) Another aspect of the present invention is a signal transmission method including transmitting the 1-bit pulse train obtained in the signal conversion method according to any one of the above (1) to (7) to a signal transmission line.

(9) Another aspect of the present invention is a signal conversion device including a converter configured to convert an input signal into a 1-bit pulse train representing an analog signal. The 1-bit pulse train has a pulse rising waveform and a pulse falling waveform. The pulse rising waveform includes a first distortion component with respect to an ideal pulse rising waveform, and the pulse falling waveform includes a second distortion component with respect to an ideal pulse falling waveform. The first distortion component and the second distortion component are substantially line-symmetric with respect to a time axis.

(10) Another aspect of the present invention is a signal conversion device including a converter configured to convert an input signal into a 1-bit pulse train. The 1-bit pulse train has a pulse rising waveform and a pulse falling waveform. The pulse rising waveform includes a first distortion component with respect to an ideal pulse rising waveform, and the pulse falling waveform includes a second distortion component with respect to an ideal pulse falling waveform. The device further includes a suppression section configured to suppress line-asymmetry of the first distortion component and the second distortion component.

(11) When the converter outputs a 1-bit pulse train, the 1-bit pulse train may be reflected by an element connected to a stage subsequent to the converter to cause a reflected wave. This is because the 1-bit pulse train, which is a digital signal, also has a property of an analog signal. Such an unnecessary reflected wave becomes a factor that causes asymmetry of the first distortion component and the second distortion component.

Therefore, preferably, the suppression section suppresses the reflected wave of the signal output from the converter.

In this case, signal reflection that may cause the asymmetry can be suppressed, and thus degradation of signal characteristics can be prevented.

(12) Preferably, the suppression section is an attenuator connected between the converter and a reflection element that causes the reflected wave. In this case, since the reflected wave multiply reflects between the converter and the reflection element that causes the reflected wave, the reflected wave is more attenuated than the quantized signal. Thus, influence of the reflected wave can be reduced.

(13), (14) Preferably, the suppression section is configured as a branching path connected between the converter and a reflection element that causes the reflected wave when a signal outside a predetermined frequency band arrives at the reflection element, and the branching path guides and terminates the signal outside the predetermined frequency band. Further, preferably, the branching path includes: a branching path side filter that blocks passing of a signal inside the predetermined frequency band, and allows passing of the signal outside the predetermined frequency band; and a terminator that terminates the signal outside the predetermined frequency band, which has passed through the branching path side filter.

In this case, the signal within the predetermined frequency band is guided to the reflection element side which is the original route, while the signal outside the predetermined frequency band is guided to the branching path by the branching path side filter. Therefore, the signal outside the predetermined frequency band, which may be reflected by the analog filter, can be, without being reflected, guided to the branching path side where the terminator is provided, and terminated. As a result, signal reflection can be suppressed while obtaining a necessary main signal.

(15) The suppression section and the reflection element that causes the reflected wave may form a bridged-T filter having a predetermined signal band as a passband. In this case, a signal outside the passband can be terminated without being reflected. Thus, signal reflection can be suppressed.

(16) Preferably, the suppression section and the reflection element that causes the reflected wave form a filter processing section. The filter processing section includes: a generator that generates a first signal and a second signal from an output of the converter; and a synthesizer that synthesizes the first signal and the second signal to generate a synthesis signal, and output the synthesis signal as a signal in a predetermined signal band. The first signal and the second signal are set at phases such that, when being synthesized with each other, signals in the predetermined signal band, which are respectively included in the first signal and the second signal, are prevented from being canceled out while signals outside the predetermined signal band, which are respectively included in the first signal and the second signal, can be canceled out.

In this case, the signal within the predetermined signal band can be obtained while the signals outside the predetermined signal band, which can be reflected, are canceled out without being reflected. As a result signal reflection can be suppressed.

(17) In the above signal conversion device, preferably, the first signal and the second signal are in phase with each other within the predetermined signal band, and are opposite in phase to each other outside the predetermined signal band.

(18) When the generator generates, from an output signal as the output of the converter, an inverted signal opposite in phase to the output signal, the generator may further generate, from one of the output signal and the inverted signal, a signal in which a portion thereof within the predetermined signal band is opposite in phase to the one signal and a portion thereof outside the signal band is in phase with the one signal, as the first signal, and generate the other one of the output signal and the inverted signal, as the second signal.

(19) Preferably, the converter outputs a differential signal composed of a positive signal and a negative signal, and the generator generates, from one of the positive signal and the negative signal, a signal in which a portion thereof within the predetermined signal band is opposite in phase to the one signal and a portion thereof outside the signal band is in phase with the one signal, as the first signal, and generates the other one of the positive signal and the negative signal, as the second signal.

(20) The signal conversion device may further include a control section configured to control the converter. The converter may convert the input signal into a 1-bit pulse train by delta-sigma modulation, and a quantization noise stop band of the delta-sigma modulation is variable. The control section may perform, according to the input signal, a control to change the quantization noise stop band.

(21) Another aspect of the present invention is a transmitter. The transmitter includes the signal conversion device according to the above (9) or (10), and the transmitter transmits the 1-bit pulse train output from the signal conversion device to a signal transmission line.

(22) Another aspect of the present invention is a signal conversion method including converting an input signal into a 1-bit pulse train by delta-sigma modulation. The 1-bit pulse train has a pulse rising waveform and a pulse falling waveform. The pulse rising waveform includes a first distortion component with respect to an ideal pulse rising waveform, and the pulse falling waveform includes a second distortion component with respect to an ideal pulse falling waveform. The first distortion component and the second distortion component are substantially line-symmetric with respect to a time axis.

DESCRIPTION OF EMBODIMENTS

Hereinafter, preferred embodiments will be described with reference to the drawings.

[1. System Configuration]

Figure 1:
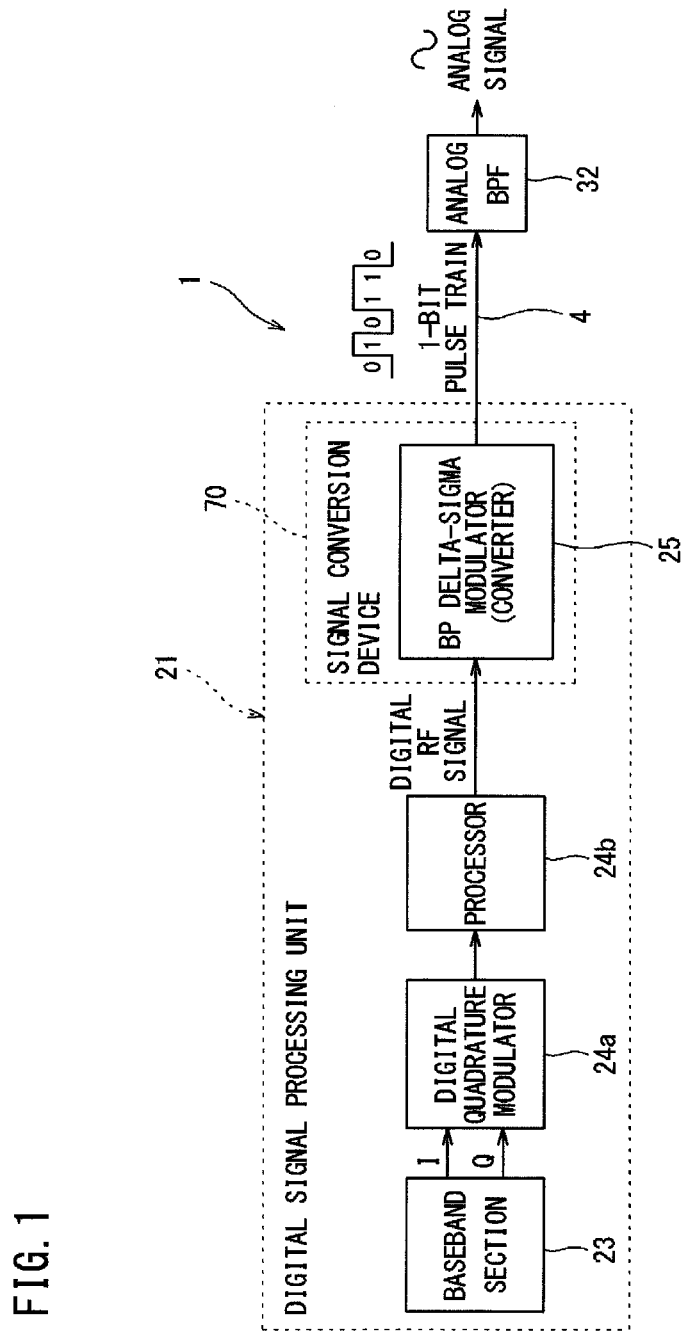
FIG. 1 is a block diagram showing a system including a signal conversion device according to a first embodiment.

FIG. 1 shows a system 1 including a signal conversion device (signal conversion unit) 70 according to a first embodiment. The system 1 includes a digital signal processing unit 21 including the signal conversion device 70, and an analog filter 32.

The digital signal processing unit 21 outputs a digital signal (1-bit pulse train) representing an RF (Radio Frequency) signal as an analog signal. The RF signal is a signal to be emitted as a radio wave into space, and is, for example, an RF signal for mobile communication or an RF signal for broadcast services such as television/radio or the like.

The RF signal output from the digital signal processing unit 21 is provided to the analog filter (a band-pass filter or a low-pass filter) 32. The analog signal represented by the 1-bit pulse train also includes a noise component other than the RF signal. The noise component is removed by the analog filter 32.

The 1-bit pulse train is restored to a pure analog signal by simply being passed through the analog filter 32.

As described above, the digital signal processing unit 21 can substantially generate an RF signal by generating a 1-bit pulse train in digital signal processing. Therefore, when the 1-bit pulse train representing the RF signal is provided to a circuit for processing an RF signal (e.g., an RF signal receiver such as a radio communication device or a television receiver), the circuit can process the 1-bit pulse train as an analog signal. In this case, the analog filter 32 may be included in the circuit for processing an RF signal.

Whether to use a band-pass filter or a low-pass filter as the analog filter 32 is appropriately determined based on the frequency of the RF signal.

A band-pass filter is used as the analog filter 32 when the signal conversion device 70 performs signal conversion based on band-pass delta-sigma modulation, whereas a low-pass filter is used as the analog filter 32 when the signal conversion device 70 performs signal conversion based on low-pass delta-sigma modulation.

A signal transmission line 4 provided between the digital signal processing unit 21 and the analog filter 32 may be a signal wiring formed on a circuit board, or a transmission line such as an optical fiber or an electric cable. The signal transmission line 4 need not be a dedicated line for transmitting a 1-bit pulse train, and may be a communication network that performs packet communication, such as the Internet. When a communication network that performs packet communication is used as the signal transmission line 4, the transmitter side (the digital signal processing unit 21 side) converts a 1-bit pulse train into a bit string and transmits the bit string to the signal transmission line 4, and the receiver side (analog filter 32 side) restores the received bit string to the original 1-bit pulse train.

The digital signal processing unit 21 can be regarded as a transmitter that transmits a 1-bit pulse train to the signal transmission line 4. In this case, a device including the analog filter 32 is a receiver of an RF signal.

Alternatively, the entire system 1 may be a transmitter 1. For example, the transmitter 1 may be configured to amplify, with an amplifier, a signal output from the digital signal processing unit 21, and output the signal from an antenna. In this case, the analog filter 32 may be provided between the digital signal processing unit 21 and the antenna, or the antenna may act as the analog filter 32.

The digital signal processing unit 21 includes a baseband section 23 that outputs a baseband signal (IQ signal) as a transmission signal, a modulator (quadrature modulator) 24a that modulates the baseband signal, a processor 24b, and a signal conversion device (signal conversion unit) 70.

The baseband section 23 outputs the IQ baseband signal (each of I signal and Q signal) as digital data.

The modulator 24a converts the IQ baseband signal into an intermediate frequency signal. The modulator 24a is configured as a digital quadrature modulator that performs quadrature modulation by digital signal processing. Accordingly, from the quadrature modulator 24a, a signal in a digital signal format (digital IF signal) represented by multi-bit digital data (discrete values) is output.

The modulator 24a generating a modulated wave is not limited to the quadrature modulator, and may be another type of modulator for generating a modulated wave.

The IF signal output from the modulator 24a is provided to the processor 24b in the digital signal processing unit 21. The processor 24b subjects the IF signal to various kinds of digital signal processing such as DPD (Digital Pre-distortion), CFR (Crest Factor Reduction), DUC (Digital Up Conversion), and the like. The processor 24b outputs an RF signal generated through the various kinds of digital signal processing.

The various kinds of digital processing to be performed in the processor 24b may be performed at a stage preceding the quadrature modulation by the quadrature modulator 24a as long as the digital RF signal generated through the various kinds of digital processing is provided to the signal conversion unit 70.

The digital RF signal output from the processor 24b is provided to the signal conversion unit 70. The signal conversion unit 70 of the present embodiment is configured to have a band-pass delta-sigma modulator (converter) 25. The converter 25 may be a low-pass delta-sigma modulator or a PWM modulator.

The delta-sigma modulator 25 performs delta-sigma modulation on the RF signal as an input signal, and outputs a 1-bit quantized signal (1-bit pulse train). The 1-bit pulse train output from the delta-sigma modulator 25 is a digital signal, but represents an analog RF signal.

The 1-bit pulse train output from the delta-sigma modulator 25 is output from the digital signal processing unit 21 to the signal transmission line 4, as an output signal of the digital signal processing unit 21.

[2. Delta-Sigma Modulation]

Figure 2:
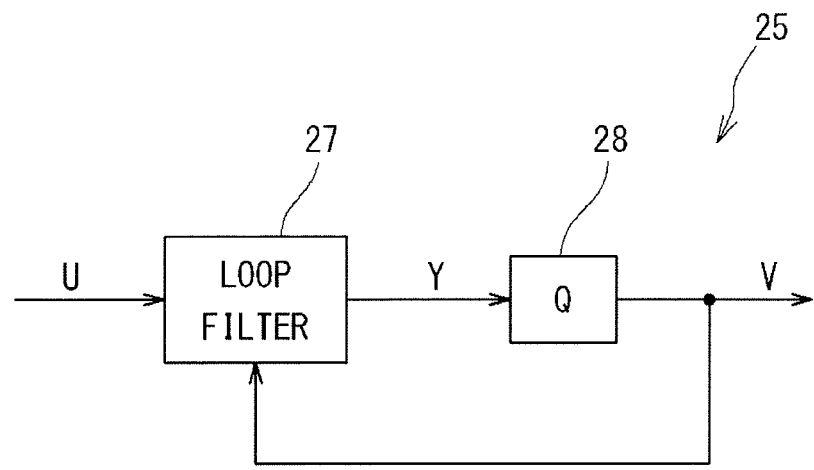
FIG. 2 is a block diagram showing a delta-sigma modulator.

As shown in FIG. 2, the delta-sigma modulator 25 includes a loop filter 27 and a quantizer 28 (refer to Non-Patent Literature 1).

In the delta-sigma modulator 25 shown in FIG. 2, an input (an RF signal in the present embodiment) U to the delta-sigma modulator 25 is provided to the loop filter 27. An output Y from the loop filter 27 is provided to the quantizer (1-bit quantizer) 28. An output (quantized signal) V from the quantizer 28 is provided to the loop filter 27 as another input.

The characteristic of the delta-sigma modulator 25 can be expressed by a signal transfer function (STF) and a noise transfer function (NTF).

That is, when an input to the delta-sigma modulator 25 is defined as U, an output from the delta-sigma modulator 25 is defined as V, and quantization noise is defined as E, the characteristic of the delta-sigma modulator 25 expressed in the z domain is as follows:

[Math. 1]

$$V(z) = STF(z)U(z) + NTF(z)E(z) \qquad (1)$$

Therefore, when desired NTF and STF are given, the transfer function of the loop filter 27 can be obtained.

Figure 3:
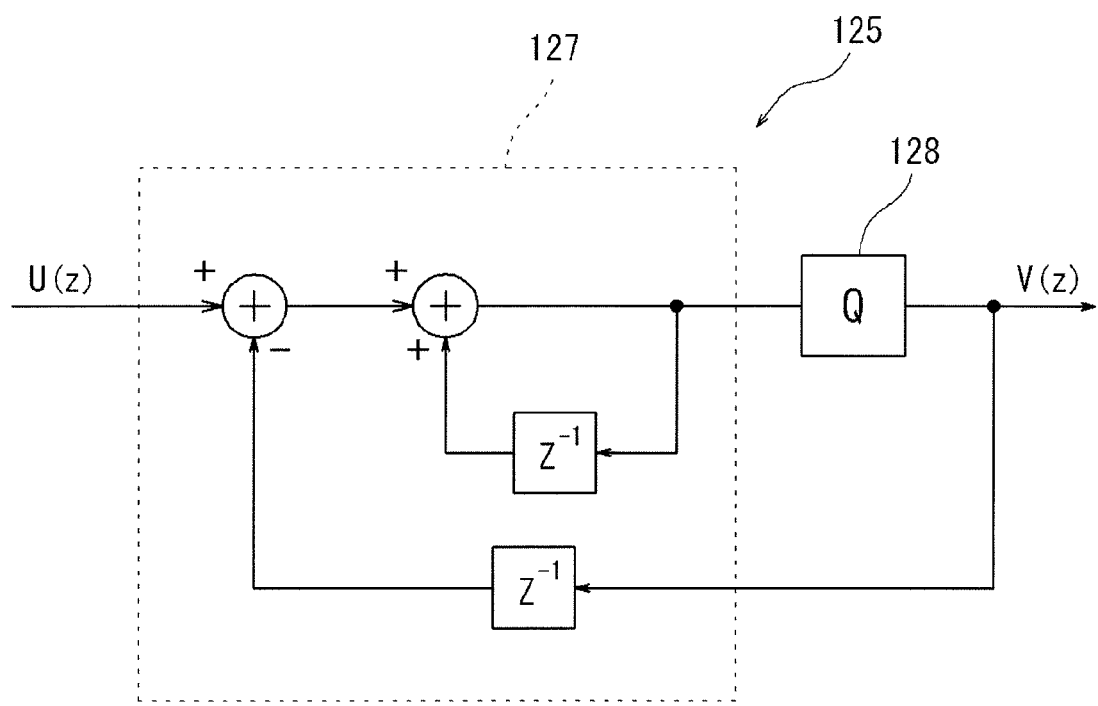
FIG. 3 shows a first-order low-pass delta-sigma modulator.

FIG. 3 is a block diagram showing a linear z domain model of a first-order low-pass delta-sigma modulator 125. Reference numeral 127 denotes a part corresponding to a loop filter, and reference numeral 128 denotes a quantizer. When an input to the delta-sigma modulator 125 is defined as U(z), an output therefrom is defined as V(z), and quantization noise is defined as E(z), the characteristic of the delta-sigma modulator 125 expressed in the z domain is as follows:

$$V(z)=U(z)+(1-z^{-1})E(z)$$

That is, in the first-order low-pass delta-sigma modulator 125 shown in FIG. 3, the signal transfer function STF and the noise transfer function NTF are expressed as follows:

signal transfer function $STF(z)=1$ noise transfer function $NTF(z)=1-z^{-1}$

According to Non-Patent Literature 1, by performing the following conversion on a low-pass delta-sigma modulator, the low-pass delta-sigma modulator can be converted into a band-pass delta-sigma modulator.

[Math. 2]

$$z \to -z^2 \quad (2)$$

According to the above conversion formula, by replacing z in the z domain model of the low-pass delta-sigma modulator 125 with $z'=-z^2$, a band-pass delta-sigma modulator is obtained.

When the above conversion formula is used, an n-th order low-pass delta-sigma modulator (n is an integer not smaller than 1) can be converted into a 2n-th order band-pass delta-sigma modulator.

The present inventor has discovered a conversion formula for obtaining, from a low-pass delta-sigma modulator, a band-pass delta-sigma modulator having a desired frequency $f_0$ ($\theta=\theta_0$) as the center frequency $f_0$. This conversion formula is, for example, formula (3) below:

[Math. 3]

$$z \to z \frac{z - \cos\theta_0}{(\cos\theta_0)z - 1} \quad (3)$$

where
$\theta_0 = 2\pi \times (f_0/fs)$, and
fs is a sampling frequency of the delta-sigma modulator.

The conversion formula (2) relates to a specific frequency $\theta_0 = \pi/2$. In contrast, the conversion formula (3) has been generalized for any desired frequency ($\theta_0$).

Figure 4:
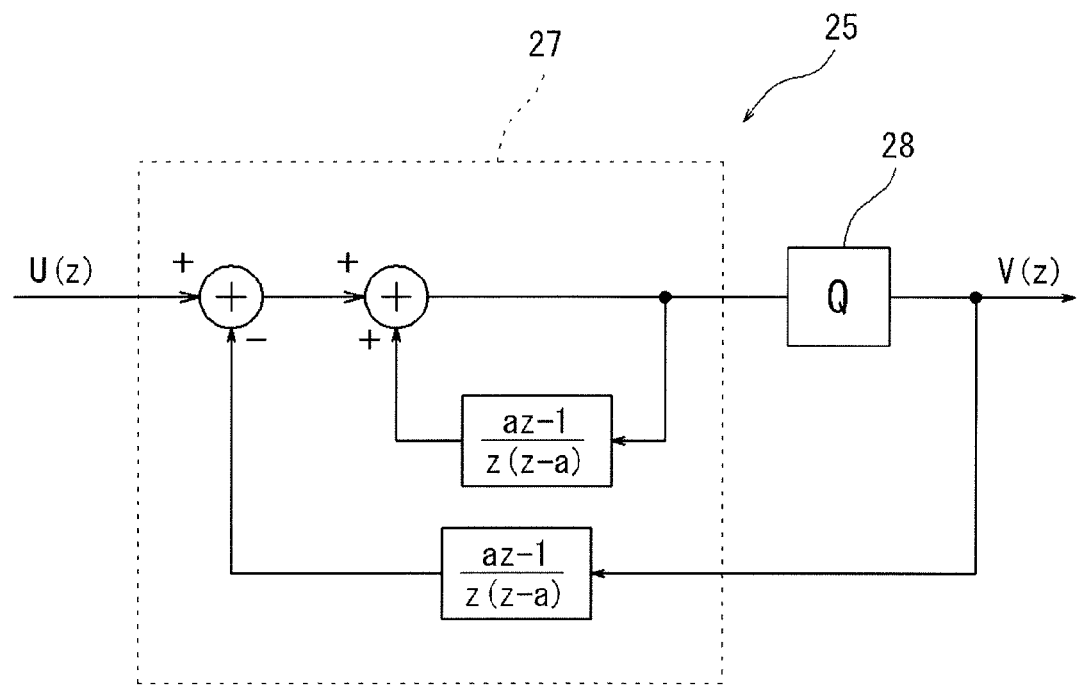
FIG. 4 shows a second-order band-pass delta-sigma modulator obtained through conversion of the first-order low-pass delta-sigma modulator.

FIG. 4 shows a second-order band-pass delta-sigma modulator 25 obtained through conversion of the first-order low-pass delta-sigma modulator 125 shown in FIG. 3 based on the conversion formula (3).

In the conversion from FIG. 3 to FIG. 4, the following conversion formula which is formula (3) where $\cos\theta_0$ is replaced with a is used for convenience in expression.

[Math. 4]

$$z \to z \frac{z - a}{az - 1}$$

The conversion to the band-pass delta-sigma modulator is also applicable to other higher-order low-pass delta-sigma modulators (e.g., CIFB structure, CRFF structure, CIFF structure, and the like described in Non-Patent Literature 1).

[3. Relationship Between Signal Characteristic and 1-Bit Pulse Train Waveform]

Figure 5:
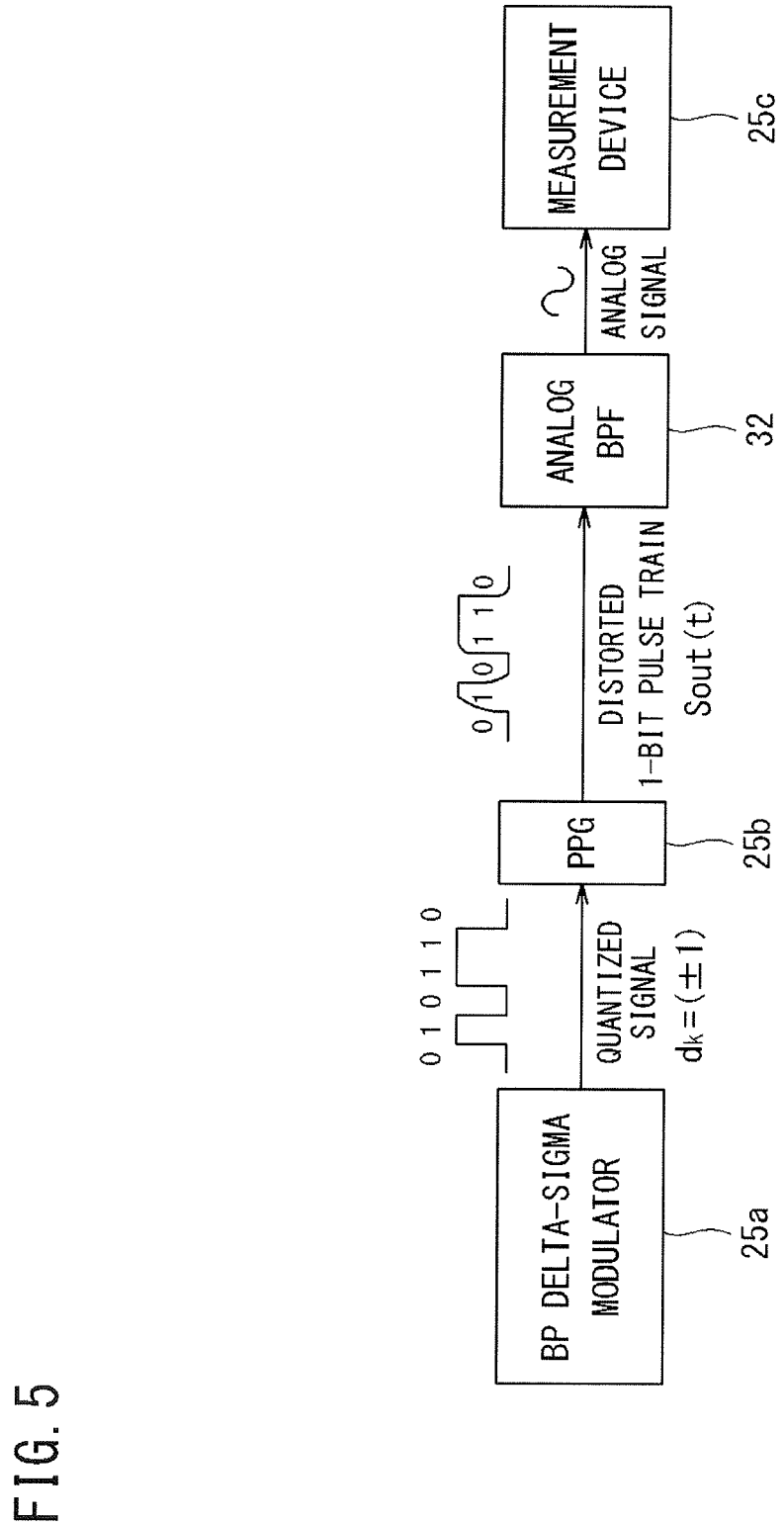
FIG. 5 is a block diagram showing a device used for simulation.

FIG. 5 shows a device configuration used for examining the relationship between the signal characteristic of the RF signal represented by the 1-bit pulse train output from the delta-sigma modulator (converter) 25, and the analog waveform of the 1-bit pulse train.

Since the actual band-pass delta-sigma modulator 25 shown in FIG. 1 outputs a quantized signal as a pulse, the modulator 25 includes, in at least a part thereof, hardware such as a flip-flop.

However, as the delta-sigma modulator shown in FIG. 5, a band-pass delta-sigma modulator 25a configured by software was used. A quantized signal $d_k$ output from the band-pass delta-sigma modulator 25a configured by software is provided to a pulse pattern generator (PPG) 25b. The pulse pattern generator 25b, based on the quantized signal $d_k$, can output a 1-bit pulse train $S_{out}(t)$ that is distorted in any shape with respect to an ideal waveform (perfect square wave). The distorted 1-bit pulse train $S_{out}(t)$ corresponds to a 1-bit pulse train output from the actual band-pass delta-sigma modulator 25.

An output circuit of the pulse pattern generator 25b has fast response performance sufficient to generate a waveform that can be regarded as the ideal waveform. Accordingly, the pulse pattern generator 25b is also able to output a 1-bit pulse train $S_{out}(t)$ having the ideal waveform.

The signal output from the pulse pattern generator 25b passes through the analog band-pass filter 32, and is provided to a measurement device 25c.

The output $S_{out}(t)$ of the pulse pattern generator 25b is defined as shown in the following formula (A):

[Math. 5]

$$S_{out}(t)=S_{Ideal}(t)+\Sigma_k f(t-kT)\{U(t-kT)-U(t-T-kT)\} \quad (A)$$

$S_{Ideal}(t)$, the first term of formula (A), expresses the ideal square waveform of the quantized signal $d_k$ (=±1), and is defined as shown in the following formula (B). The quantized signal $d_k$ takes +1 as a value corresponding to a high level of the pulse, and takes −1 as a value corresponding to a low level of the pulse. U(t) is a unit step function.

[Math. 6]

$$S_{Ideal}(t)=\Sigma_k d_k\{U(t-kT)-U(t-T-kT)\} \quad (B)$$

The second term of formula (A) indicates a difference between $S_{out}(t)$ corresponding to the actual waveform and the ideal waveform $S_{Ideal}(t)$. In addition, f(t−kt) in the second term is defined as shown in the following formula (C). Sing is a sign function.

[Math. 7]

$$f(t-kT) = \begin{cases} f_{rise}(t-kT) & \ldots \text{Sing}(d_k - d_{k-1}) = 1 \quad (C\text{-}1) \\ f_{fall}(t-kT) & \ldots \text{Sing}(d_k - d_{k-1}) = -1 \quad (C\text{-}2) \\ 0 & \ldots \text{Sing}(d_k - d_{k-1}) = 0 \quad (C\text{-}3) \end{cases} \quad (C)$$

[Math. 8]

$$\begin{cases} f_{rise}(t) = f_{Asym}(t) + f_{Sym}(t) & (D\text{-}1) \\ f_{fall}(t) = f_{Asym}(t) - f_{Sym}(t) & (D\text{-}2) \end{cases} \quad (D)$$

In formula (C), (C-1) represents a case where the sign of a value indicating a difference between a value $d_k$ of a certain quantized signal and a value $d_{k-1}$ of a quantized signal which is temporally one signal before the certain quantized signal is plus, that is, a case where the quantized signal $d_k$ is at a rising edge of the pulse.

(C-2) represents a case where the sign of the value indicating the difference between the value $d_k$ of the certain quantized signal and the value $d_{k-1}$ of the quantized signal which is temporally one signal before the certain quantized signal is minus, that is, a case where the quantized signal $d_k$ is at a falling edge of the pulse.

(C-3) represents a case where the value indicating the difference between the value $d_k$ of the certain quantized signal and the value $d_{k-1}$ of the quantized signal which is temporally one signal before the certain quantized signal is zero, that is, a case where the value of the pulse does not change.

In addition, $f_{rise}(t)$ and $f_{fall}(t)$ indicate a rising waveform and a falling waveform, respectively. The rising waveform $f_{rise}(t)$ and the falling waveform $f_{fall}(t)$ are set to any shapes for simulation.

Further, each of $f_{rise}(t)$ and $f_{fall}(t)$ can be decomposed to a symmetric component $f_{sym}(t)$ and an asymmetric component $f_{Asym}(t)$ as shown in formula (D).

The asymmetric component $f_{Asym}(t)$ can be obtained from formula (D) according to the following formula (E):

[Math. 9]

$$f_{Asym}(t) = \frac{f_{rise}(t) + f_{fall}(t)}{2} \quad (E)$$

Formula (E) indicates that the asymmetric component $f_{Asym}(t)$ is eliminated when the rising waveform $f_{rise}(t)$ and the falling waveform $f_{fall}(t)$ satisfy the relationship expressed by the following formula (F):

[Math. 10]

$$f_{rise}(t) = -f_{fall}(t) \quad (F)$$

When formula (F) is satisfied, the rising waveform $f_{rise}(t)$ and the falling waveform $f_{fall}(t)$ are line-symmetric with respect to the time axis. That is, when a pulse waveform satisfying formula (F) is shown as an eye pattern, the eye pattern is line-symmetric with respect to the time axis.

FIG. 6 shows a pulse waveform (symmetric waveform) that satisfies formula (F). FIG. 6A shows an eye pattern of a symmetric waveform $S_{out}(t)$. This eye pattern is line-symmetric with respect to the time axis. It is assumed that the time axis is in the middle (0) between the low level (−1) and the high level (+1) of the pulse (the same applies hereinafter).

Figure 6A:
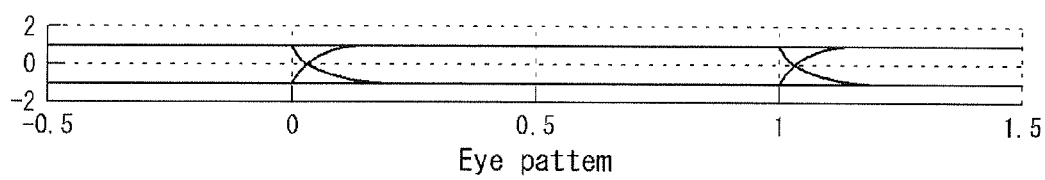
FIG. 6A shows an eye pattern of a symmetric waveform $S_{out}(t)$.
Figure 6B:
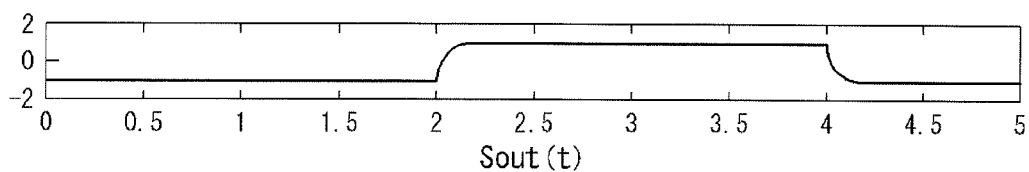
FIG. 6B shows a time axis waveform of the symmetric waveform $S_{out}(t)$.
Figure 6C:
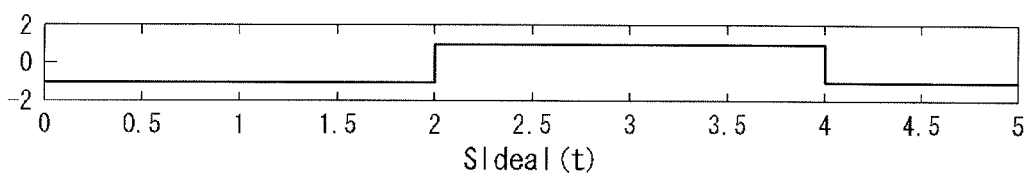
FIG. 6C shows an ideal waveform $S_{Ideal}(t)$ with respect to the symmetric waveform.
Figure 6D:
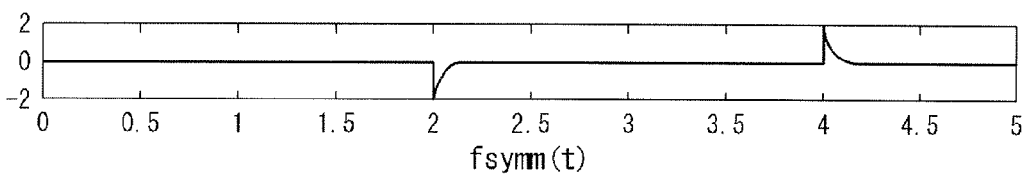
FIG. 6D shows a symmetric component $f_{sym}(t)$ in the rising waveform $f_{rise}(t)$ and the falling waveform $f_{fall}(t)$ in the symmetric waveform.
Figure 6E:
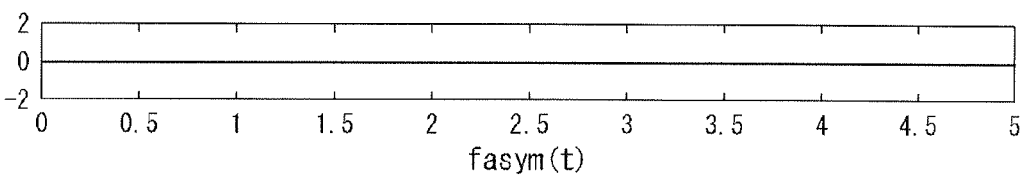
FIG. 6E shows an asymmetric component $f_{Asym}(t)$ in the rising waveform $f_{rise}(t)$ and the falling waveform $f_{fall}(t)$ in the symmetric waveform.

FIG. 6B shows a time axis waveform of the symmetric waveform $S_{out}(t)$, FIG. 6C shows an ideal waveform $S_{Ideal}(t)$ with respect to the symmetric waveform, FIG. 6D shows a symmetric component $f_{sym}(t)$ in the rising waveform $f_{rise}(t)$ and the falling waveform $f_{fall}(t)$ in the symmetric waveform, and FIG. 6E shows an asymmetric component $f_{Asym}(t)$ in the rising waveform $f_{rise}(t)$ and the falling waveform $f_{fall}(t)$ in the symmetric waveform.

As shown in FIG. 6, the symmetric waveform is distorted with respect to the ideal waveform $S_{Ideal}(t)$, and has distortion components. Specifically, the symmetric waveform has a distortion component (first distortion component) in the rising waveform $f_{rise}(t)$ of the pulse and a distortion component (second distortion component) in the falling waveform $f_{fall}(t)$ of the pulse.

When formula (F) is satisfied, the distortion components include the symmetric component $f_{sym}(t)$ (refer to FIG. 6D) but do not include the asymmetric component $f_{Asym}(t)$ (refer to FIG. 6E).

In the symmetric waveform, when the rising waveform $f_{rise}(t)$ and the falling waveform $f_{fall}(t)$ are overlapped such that a rising start point and a falling start point coincide with each other on the time axis, like an eye pattern, the rising waveform $f_{rise}(t)$ and the falling waveform $f_{fall}(t)$ are line-symmetric with respect to the time axis because the transition time (rising time) of the rising waveform $f_{rise}(t)$ is equal to the transition time (falling time) of the falling waveform $f_{fall}(t)$.

In other words, the distortion component (first distortion component) in the rising waveform $f_{rise}(t)$ and the distortion component (second distortion component) in the falling waveform $f_{fall}(t)$ are line-symmetric with respect to the time axis, and the asymmetric component $f_{Asym}(t)$ is zero.

FIG. 7 shows a pulse waveform (asymmetric waveform) that does not satisfy formula (F). FIG. 7A shows an eye pattern of an asymmetric waveform $S_{out}(t)$. This eye pattern is asymmetric with respect to the time axis. Specifically, in the asymmetric waveform shown in FIG. 7, the pulse falling time is longer than the pulse rising time.

Figure 7A:
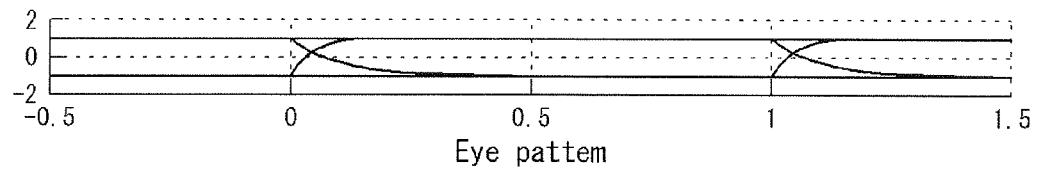
FIG. 7A shows an eye pattern of an asymmetric waveform $S_{out}(t)$.
Figure 7B:
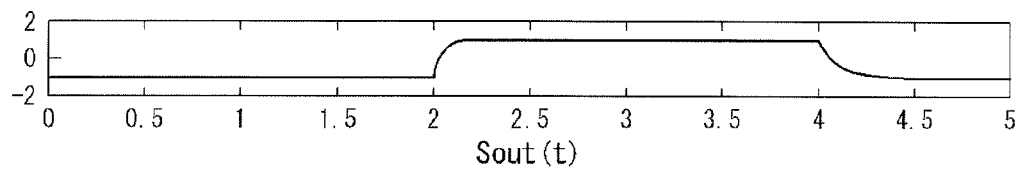
FIG. 7B shows a time axis waveform of the asymmetric waveform $S_{out}(t)$.
Figure 7C:
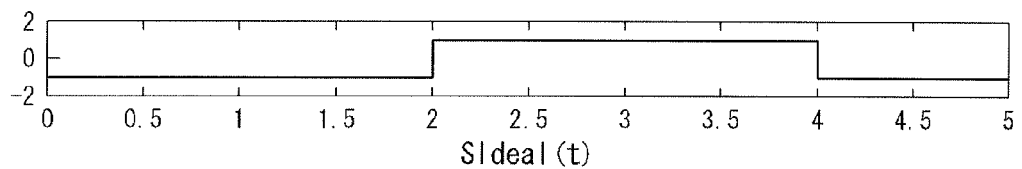
FIG. 7C shows an ideal waveform $S_{Ideal}(t)$ with respect to the asymmetric waveform.
Figure 7D:
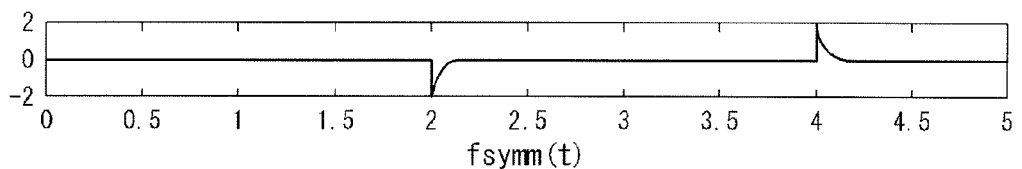
FIG. 7D shows a symmetric component $f_{sym}(t)$ in the rising waveform $f_{rise}(t)$ and the falling waveform $f_{fall}(t)$ in the asymmetric waveform.
Figure 7E:
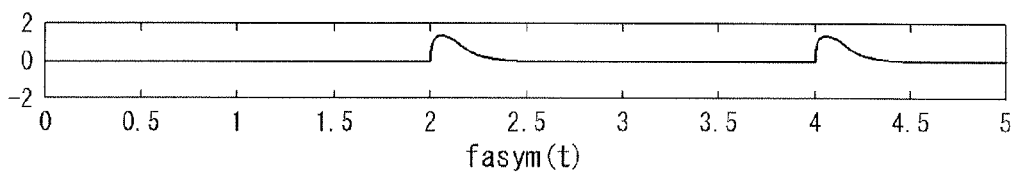
FIG. 7E shows an asymmetric component $f_{Asym}(t)$ in the rising waveform $f_{rise}(t)$ and the falling waveform $f_{fall}(t)$ in the asymmetric waveform.

FIG. 7B shows a time axis waveform of the asymmetric waveform $S_{out}(t)$, FIG. 7C shows an ideal waveform $S_{Ideal}(t)$ with respect to the asymmetric waveform, FIG. 7D shows a symmetric component $f_{sym}(t)$ in the rising waveform $f_{rise}(t)$ and the falling waveform $f_{fall}(t)$ in the asymmetric waveform, and FIG. 7E shows an asymmetric component $f_{Asym}(t)$ in the rising waveform $f_{rise}(t)$ and the falling waveform $f_{fall}(t)$ in the asymmetric waveform.

As shown in FIG. 7, the asymmetric waveform is also distorted with respect to the ideal waveform $S_{Ideal}(t)$, and has distortion components. Specifically, the asymmetric waveform has a distortion component (first distortion component) in the rising waveform $f_{rise}(t)$ of the pulse, and a distortion component (second distortion component) in the falling waveform $f_{fall}(t)$ of the pulse.

When formula (F) is not satisfied, the distortion components include the asymmetric component $f_{Asym}(t)$ as well as the symmetric component $f_{sym}(t)$ (refer to FIG. 7D and FIG. 7E).

[3.2 Influence of Asymmetric Component $f_{Asym}(t)$ on Signal Characteristic]

A simulation was performed in order to examine influences of pulse waveforms on signal characteristic (ACLR) of an analog signal. The result of the simulation is described hereinafter.

In the simulation, a sixth-order CRFB band-pass delta-sigma modulator was adopted as the delta-sigma modulator 25. A test signal to be input to the band-pass delta-sigma modulator 25 is an RF signal based on LTE (Long Term Evolution). The carrier frequency is 800 MHz, the bandwidth is 5 MHz, and four carriers are used. That is, the total bandwidth of the RF signal is 20 MHz.

TABLE 1

| Waveform | Symm./Asymm. | Rising time α | Falling time β | ACLR1 | ACLR2 | ACLR1' | ACLR2' |
|---|---|---|---|---|---|---|---|
| Ideal | Symm. | 0 | 0 | 64.4 | 62.6 | | |
| exp(x) | | 0.2 | 0.2 | 64.4 | 62.6 | | |
| | | 0.4 | 0.4 | 64.4 | 62.6 | | |
| tanh(x) | | 0.2 | 0.2 | 64.4 | 62.6 | | |
| | | 0.4 | 0.4 | 64.4 | 62.6 | | |
| exp(x) | Asymm. | 0.2 | 0.4 | 43.1 | 42.6 | 64.4 | 62.6 |
| | | 0.4 | 0.2 | 43.2 | 42.6 | 64.4 | 62.6 |
| tanh(x) | | 0.2 | 0.4 | 34.9 | 34.9 | 64.4 | 62.6 |
| | | 0.4 | 0.2 | 34.4 | 34.2 | 64.4 | 62.6 |

Pulse waveforms used in the simulation were as follows: an ideal waveform "Ideal" having transition times (rising time α and falling time β) of zero; a waveform "exp(x)" having a rising waveform and a falling waveform expressed by exponential functions; and a waveform "tanh(x)" having a rising waveform and a falling waveform expressed by hyperbolic tangent functions.

As for the exp(x) and the tanh(x), a symmetric waveform (Symm.) in which a rising waveform and a falling waveform are line-symmetric with respect to the time axis and an asymmetric waveform (Asymm.) in which a rising waveform and a falling waveform are line-asymmetric with respect to the time axis, were used.

As for the line-symmetric waveform, the rising time α and the falling time β were made equal to each other (α=β), and simulations were performed for two cases where α=β=0.2 and where α=β=0.4.

As for the line-asymmetric waveform, the rising time α and the falling time β were made different from each other (α ≠ β), and simulations were performed for two cases where α=0.2 and β=0.4, and where α=0.4 and β=0.2.

Figure 8:
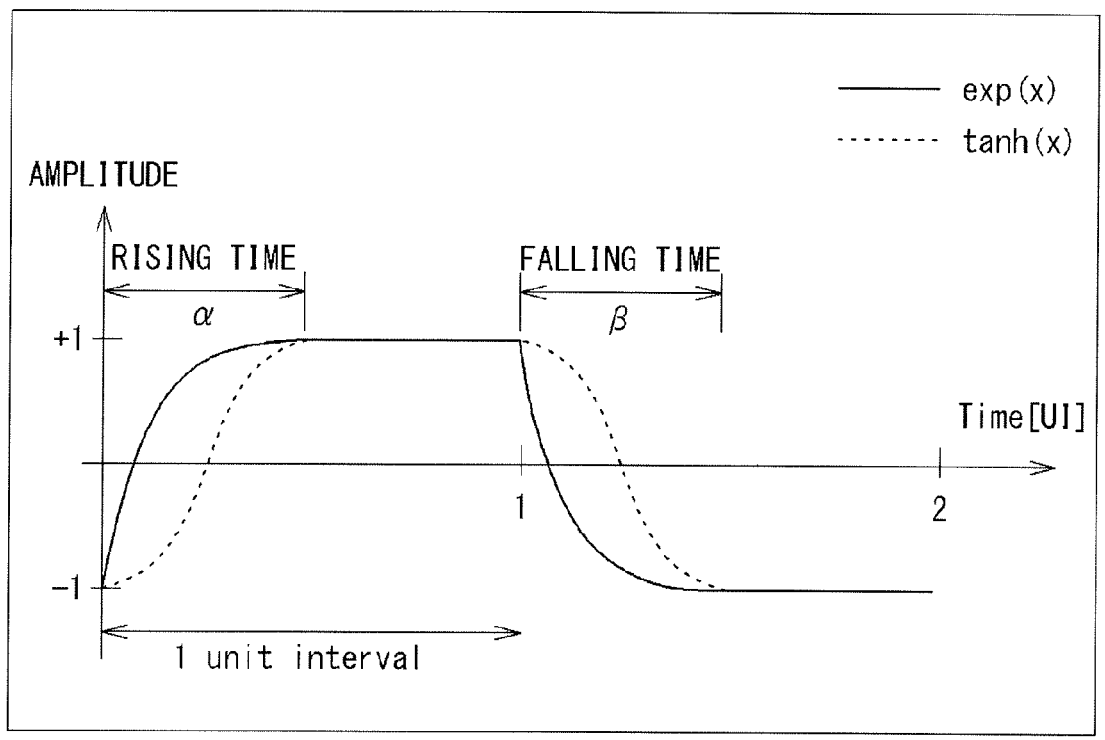
FIG. 8 is a diagram for explaining simulation parameters.

FIG. 8 shows definitions of simulation parameters (the waveforms and the transition times α and β). In FIG. 8, the rising waveform and the falling waveform of the exp(x) are shown by solid lines, and the rising waveform and the falling waveform of the tan h(x) are shown by dotted lines.

The transition times α and β are each expressed as a ratio to a unit interval (UI). The unit interval is an interval of one pulse corresponding one quantized signal, and has a length of 1/fs.

The rising time is a time period during which a pulse at a low level (−1) reaches a high level (+1), and the falling time is a time period during which the pulse at the high level (+1) reaches the low level (−1).

With reference to the simulation results shown in Table 1, ACLR1 indicates an adjacent channel leakage power ratio, and ACLR2 indicates a next adjacent channel leakage power ratio. In addition, ACLR1' and ACLR2' indicate an adjacent channel leakage power ratio and a next adjacent channel leakage power ratio, respectively, in the case where the asymmetric component $f_{Asym}(t)$ is eliminated from the asymmetric waveform (Asymm.).

According to the simulation results shown in Table 1, as for the symmetric waveform (Symm.), ACLR1 and ACRL2 similar to those of the ideal waveform were obtained for both the exp(x) and the tan h(x) which are not ideal waveforms. In addition, in the symmetric waveform (Symm.), the ACLR1 and the ACRL2 were not influenced by the difference between the transition times α and β.

Therefore, it is considered that the lengths of the transition times α and β are not important to the signal characteristic (ACLR1 and ACLR2). That is, even if the pulse waveform is distorted with respect to the ideal waveform, the ACLR1 and the ACRL2 are not reduced as long as the pulse waveform is a symmetric waveform. Therefore, it is considered that the distortion component itself included in the pulse waveform does not adversely affect the signal characteristic.

On the other hand, as for the asymmetric waveform (Asymm.), for both the exp(x) and the tan h(x), the ACLR1 and the ACLR2 were reduced as compared to those in the symmetric waveform (Symm.). However, when the asymmetric component $f_{Asym}(t)$ was eliminated from each asymmetric waveform (Asymm.), the ACLR1' and the ACLR2' were equal to the ACLR1 and the ACLR2 of the symmetric waveform (Symm.).

Thus, it is found that degradation of the ACLR1 and the ACLR2 is caused by the asymmetric component $f_{Asym}(t)$.

FIG. 9 shows a power spectrum in the case where the pulse waveform "exp(x)" is a symmetric waveform (Symm.), and FIG. 10 shows a power spectrum in the case where the pulse waveform "exp(x)" is an asymmetric waveform (Asymm.).

Figure 9A:
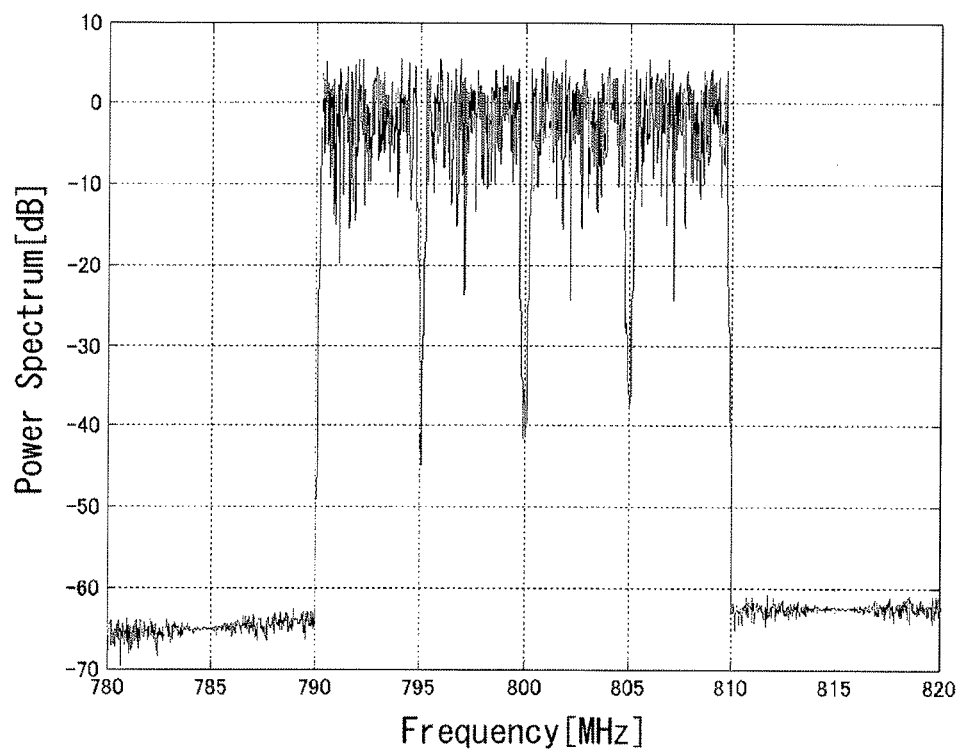
FIG. 9A shows a power spectrum of a symmetric waveform and shows the power spectrum of a 1-bit pulse train $S_{out}(t)$ in the case where $\alpha=\beta=0.2$.
Figure 9B:
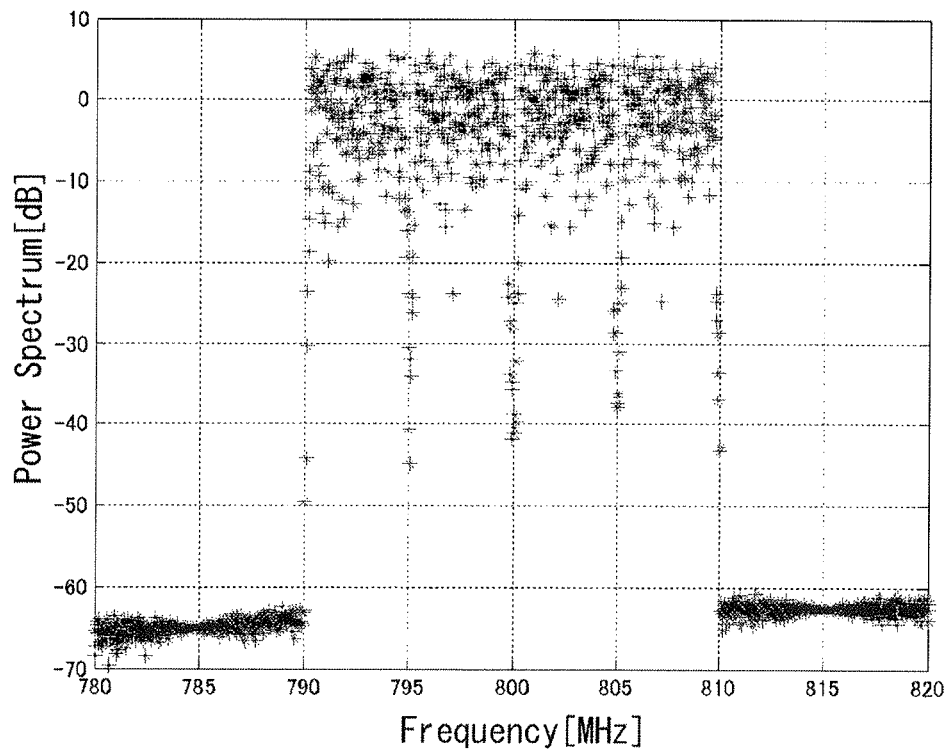
FIG. 9B shows a power spectrum of a symmetric waveform and shows the power spectrum of a 1-bit pulse train $S_{out}(t)$ in the case where $\alpha=\beta=0$ (ideal waveform).

FIG. 9A shows a power spectrum of a 1-bit pulse train $S_{out}(t)$ in the case where α=β=0.2, and FIG. 9B shows a power spectrum of a 1-bit pulse train $S_{out}(t)$ in the case where α=β=0 (ideal waveform). According to FIG. 9, the power spectrum in the case where α=β=0.2 and the power spectrum in the case where α=β=0 (ideal waveform) are almost the same. That is, even in the case where α=β=0.2, degradation from the case where α=β=0 (ideal waveform) is not recognized.

Figure 10A:
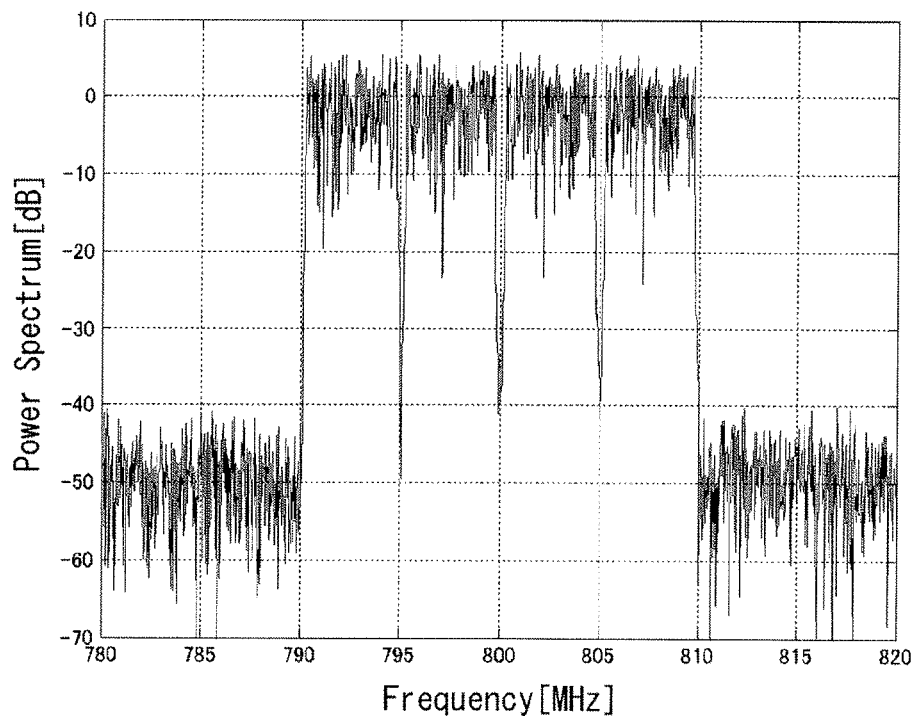
FIG. 10A shows a power spectrum of an asymmetric waveform and shows the power spectrum of the pulse waveform "exp(x)" in the case where $\alpha=0.2$ and $\beta=0.3$.
Figure 10B:
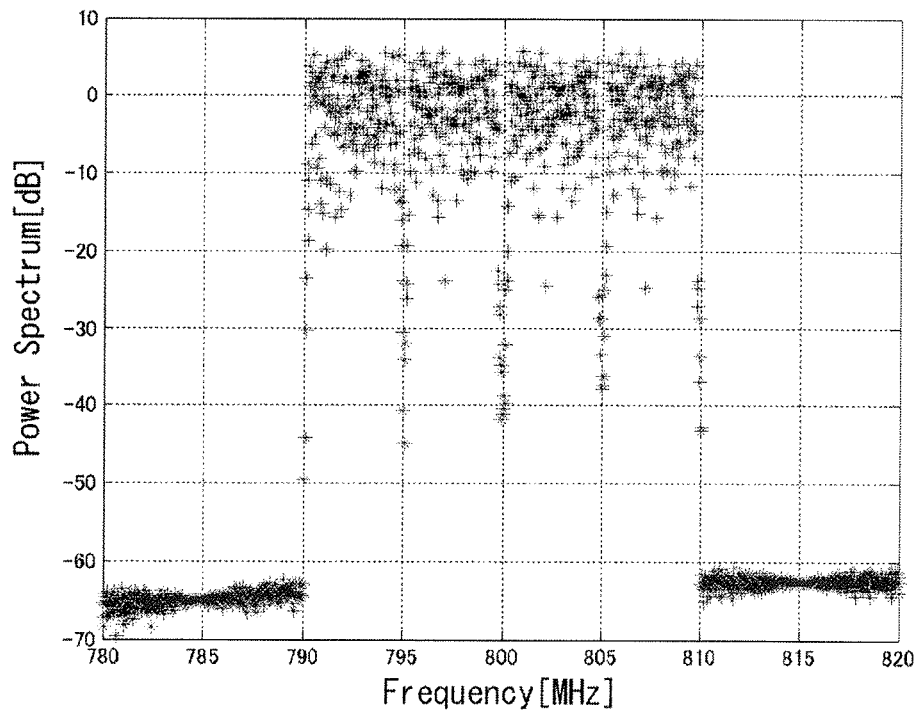
FIG. 10B shows a power spectrum of an asymmetric waveform and shows the power spectrum in the case where the asymmetric component is eliminated from the pulse waveform "exp(x)" in the case where $\alpha=0.2$ and $\beta=0.3$.

FIG. 10A shows a power spectrum of the pulse waveform "exp(x)" in the case where α=0.2 and β=0.3, and FIG. 10B shows a power spectrum in the case where the asymmetric component is eliminated from the pulse waveform "exp(x)" in the case where α=0.2 and β=0.3.

Before the elimination of the asymmetric component (the power spectrum shown in FIG. 10A), leakage power is recognized outside the frequency band of the RF signal (790 MHz to 810 MHz). On the other hand, after the elimination of the asymmetric component (the power spectrum shown in FIG. 10B), the leakage power outside the frequency band of the RF signal is reduced, resulting in a power spectrum similar to that shown in FIG. 9B.

Also for the tahn(x), measurement results similar to those shown in FIG. 9 and FIG. 10 are obtained.

Further, similar results were obtained for waveforms other than the exp(x) and the tah n(x).

According to the simulation results, when a pulse has an ideal waveform which is a complete square wave, satisfactory values of ACLR1 and ACLR2 are obtained. However, an attempt to generate more complete square wave causes an increase in the device cost. In addition, such a square wave is not desirable because of many harmonic components contained therein, and causes an increase in power consumption.

Accordingly, the actual signal conversion unit 70 (delta-sigma modulator 25) is preferably configured to output, not an ideal waveform which is a complete rectangle wave, but a pulse waveform including distortion components.

Regarding this point, according to the simulation results, even if a pulse waveform includes distortion components, the distortion components do not cause degradation of signal characteristic as long as the pulse waveform is line-symmetric with respect to the time axis, that is, as long as the pulse waveform does not include an asymmetric component.

Accordingly, the signal conversion unit 70 (delta-sigma modulator 25) can be configured to output a pulse waveform including distortion components. In this case, even if the pulse waveform output from the signal conversion unit 70 (delta-sigma modulator 25) includes distortion components, degradation of signal characteristic can be suppressed as long as the distortion components in the rising waveform and the falling waveform are substantially line-symmetric with respect to the time axis, that is, as long as the rising waveform and the falling waveform have substantially no asymmetric component.

Here, "the distortion components are substantially line-symmetric with respect to the time axis" means "the distortion components need not be completely line-symmetric with respect to the time axis". For example, the distortion components may have line symmetry such that the ACLR (adjacent channel leakage power ratio) is 45 [dB] or more. Preferably, the distortion components may have line symmetry such that the ACLR is 46 [dB] or more, more preferably, 48 [dB] or more, still more preferably, 50 [dB] or more, yet more preferably, 55 [dB] or more, and further preferably, 60 [dB] or more.

Further, the symmetry of the distortion components need not be considered regarding each pulse corresponding to the unit interval (UI), and may be considered regarding an average of distortion components in many unit intervals (UI).

Figure 11A:
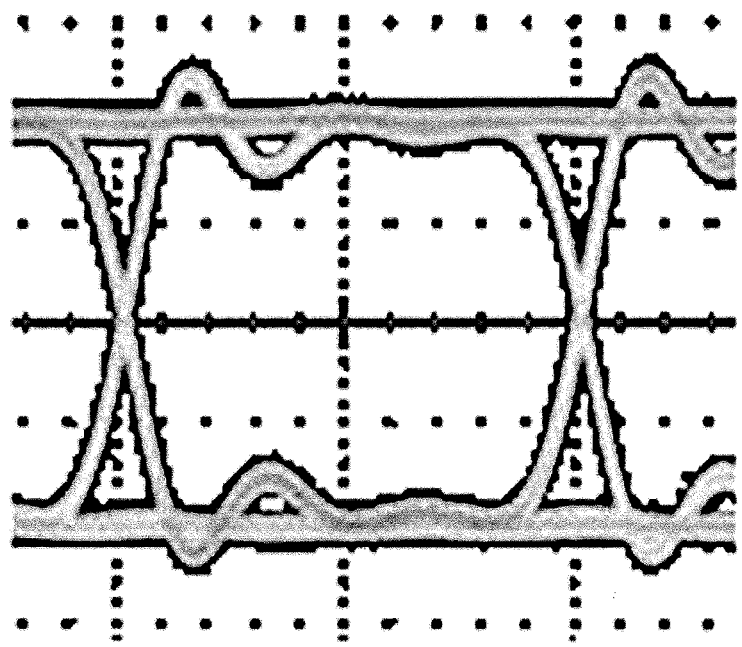
FIG. 11A shows a measured eye pattern.
Figure 11B:
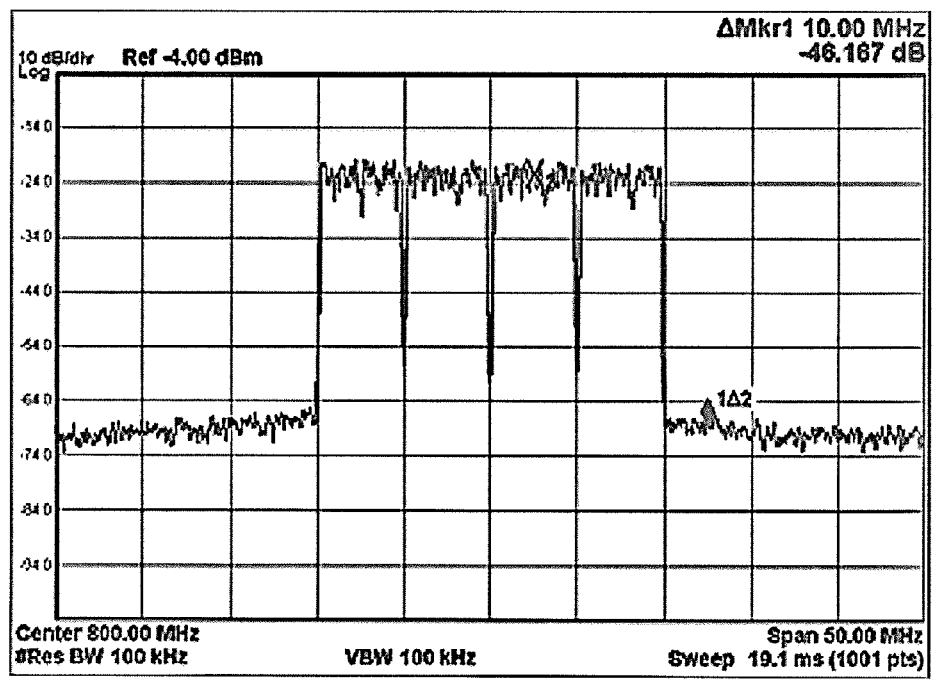
FIG. 11B shows a measured power spectrum.

FIG. 11 shows a result of measurement of a 1-bit pulse train output from the delta-sigma modulator 25 shown in FIG. 1. FIG. 11A shows a measured eye pattern, and FIG. 11B shows a measured power spectrum. The measured pulse waveform (the eye pattern shown in FIG. 11A) includes an asymmetric component, and the ACLR is 46.1 [dB].

The trajectory of the eye pattern shown in FIG. 11A was digitized, and a rising waveform $f_{rise}(t)$ and a falling waveform $f_{fall}(t)$ were extracted. Based on the extracted rising waveform $f_{rise}(t)$ and falling waveform $f_{fall}(t)$ an asymmetric component $f_{Asym}(t)$ was calculated by using formula (E).

The calculated asymmetric component $f_{Asym}(t)$ was eliminated from the measured pulse waveform, and the ACLR was calculated again. Then, the ACLR was improved to 52.3 [dB].

[4. Suppression of Distortion Components]

Figure 12:
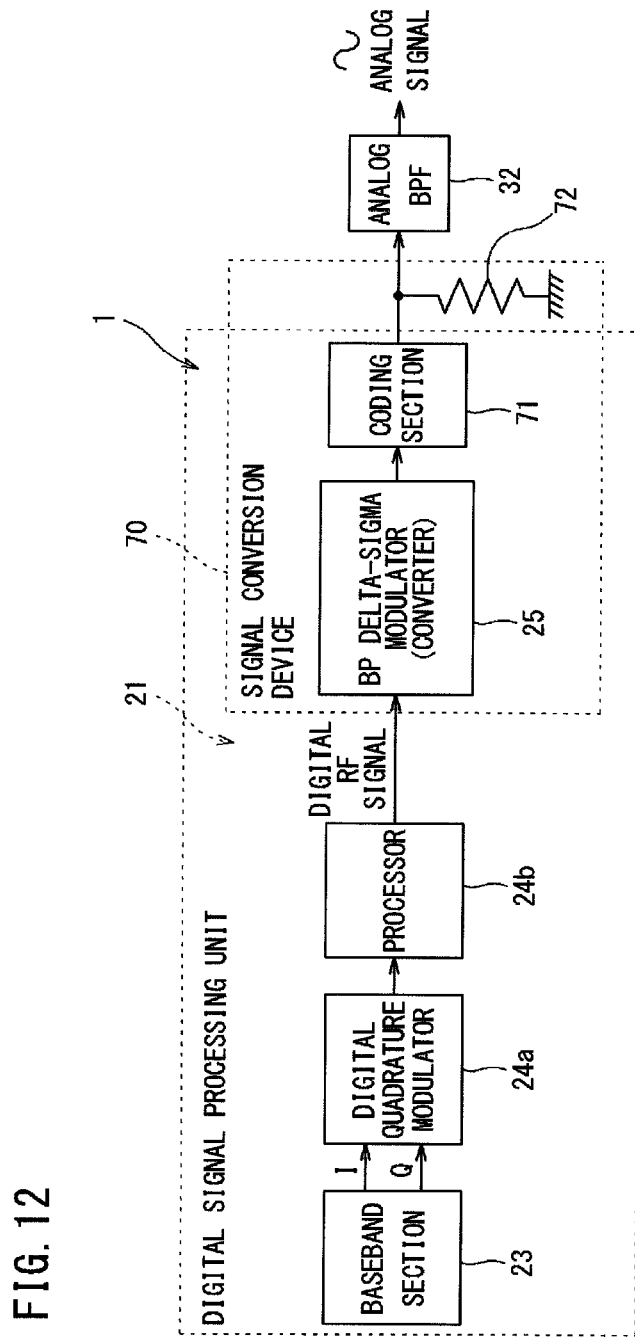
FIG. 12 is a block diagram showing a system according to a second embodiment.

FIG. 12 is a block diagram showing a system 1 according to a second embodiment. The present embodiment describes a configuration for suppressing asymmetry of distortion components in a rising waveform $f_{rise}$ and a falling waveform $f_{fall}$ in a case where the distortion components cannot be made substantially line-symmetric with respect to the time axis by means of the signal conversion unit 70 (delta-sigma modulator 25) alone.

In FIG. 12, the signal conversion device (signal conversion unit) 70 includes, in addition to the delta-sigma modulator 25, a coding section 71 and a terminator 72. The coding section 71 is configured to encode a 1-bit pulse train output from the delta-sigma modulator (converter) 25, and forms a part of the digital signal processing unit 21. The terminator (e.g., a resistor of 50 Ω) 72 is configured to terminate the output side of the coding section 71. The analog filter 32 is connected to the coding section 71 via the terminator 72.

Both the coding section 71 and the terminator 72 act as a suppressing section for suppressing distortion components and asymmetry of the distortion components. Either one of the coding section 71 and the te finator 72 may be omitted. When the coding section 71 is omitted, the terminator 72 is provided so as to terminate the output side of the delta-sigma modulator 25, and the analog filter 32 is connected to the delta-sigma modulator 25 via the terminator 72.

The coding section 71 encodes the 1-bit pulse train output from the delta-sigma modulator 25. The coding section 71 prevents fluctuation of the transition time, which is caused by that High (1) continuously occurs in the 1-bit pulse train output from the delta-sigma modulator 25.

In a circuit (e.g., a flip-flop) included in the delta-sigma modulator 25 for the purpose of pulse output, a switching element (e.g., MOS-FET) for outputting High (1) is always in its on state while High (1) continues, and the current that flows in the switching element causes an increase in temperature. Even if the switching element is turned off in this state, transition from High (1) to Low (–1) takes time, and thereby the falling time β increases. Thus, the falling time β becomes longer than the rising time α, resulting in an asymmetric component.

Therefore, the coding section 71 shown in FIG. 12 performs coding by using a transmission line code that prevents High (1) from continuing in the 1-bit pulse train.

The coding section 71 performs coding by using a Manchester code or an RZ (Return Zero) code. The present inventor has experimentally discovered that these two coding schemes enable preservation of the spectrum of an RF signal represented by a 1-bit pulse train, by simply converting the frequency of the RF signal represented by the 1-bit pulse train.

Figure 13A:
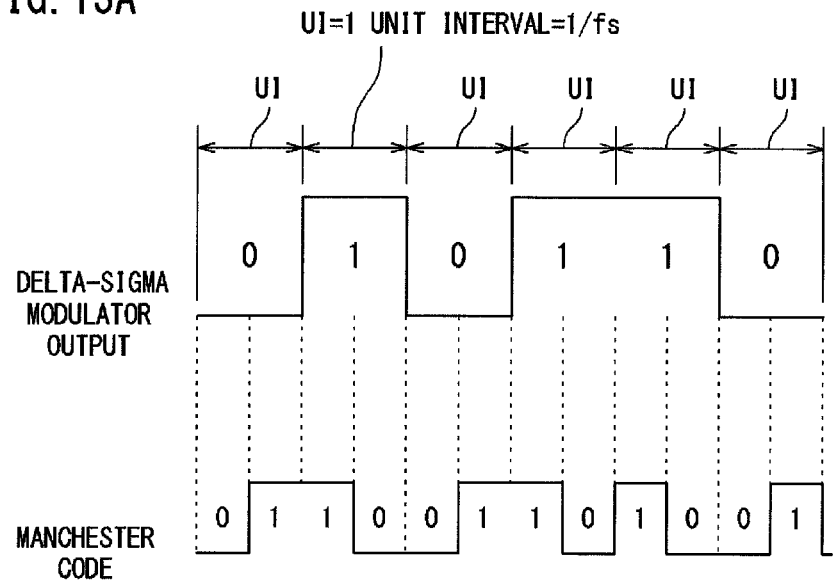
FIG. 13A is a diagram for explaining Manchester coding.

In the coding using a Manchester code, as shown in FIG. 13A, 0 (Low) is converted into "01" and 1 (High) is converted into "10". Even when 1 (High) continues in the output (1-bit pulse train) of the delta-sigma modulator 25, since the 1-bit pulse train is coded with the Manchester code, the continuous 1s (High) are converted into alternate 1 (High) and 0 (Low) in the Manchester code.

Therefore, even when 1 (High) continues in the output (1-bit pulse train) of the delta-sigma modulator 25, occurrence of continuous 1s (High) is suppressed in the output (1-bit pulse train) of the coding section 71.

As a result, in the delta-sigma modulator 25, even when the distortion components are made asymmetric due to the internal factor of the delta-sigma modulator 25, i.e., heat generated in the flip-flop due to the continuous 1s (High), since the continuous 1s (High) are reduced in the 1-bit pulse train output from the coding section 71, the asymmetry of the distortion components is also suppressed.

Figure 13B:
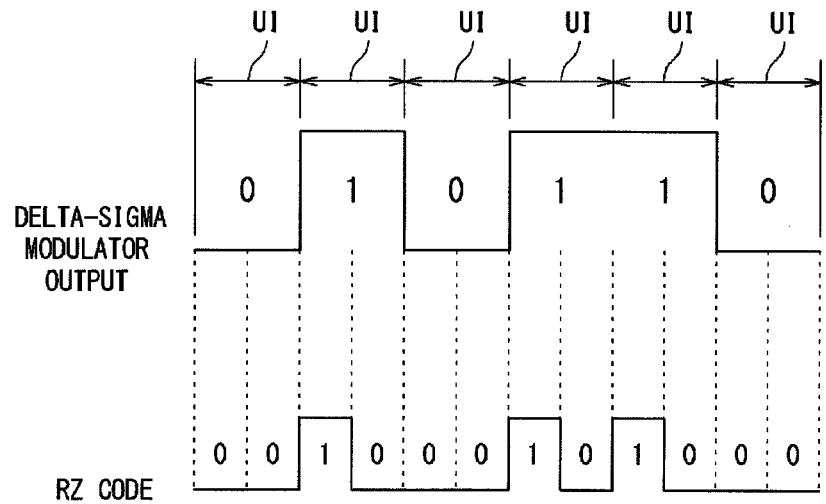
FIG. 13B is a diagram for explaining RZ coding.

In the coding using the RZ code, as shown in FIG. 13B, 0 (Low) is converted into "00" and 1 (High) is converted into "10". Even when 1 (High) continues in the output (1-bit pulse train) of the delta-sigma modulator 25, since the 1-bit pulse train is coded with the RZ code, the continuous 1s (High) are converted into alternate 1 (High) and 0 (Low) in the RZ code.

Accordingly, similar to the case of the Manchester code, the asymmetry of the distortion components in the 1-bit pulse train output from the coding section 71 is suppressed.

The terminator 72 terminates the output of the coding section 71 (or the delta-sigma modulator 25) to prevent unnecessary multiply-reflected wave from the analog filter 32. If the coding section 71 (or the delta-sigma modulator 25) is subjected to unnecessary multiply-reflected wave from the analog filter 32, the output of the coding section 71 (or the delta-sigma modulator 25) is irregularly distorted due to the reflected wave, which makes it easy to cause asymmetry of distortion components.

With the terminator 72, occurrence of such unnecessary reflected waves can be suppressed.

Accordingly, it is possible to suppress the asymmetry of distortion components, which might occur due to the external factor of the delta-sigma modulator 25, i.e., the unnecessary reflection from the analog filter 32.

An analog filter 32 configured so as not to cause reflection may be used to prevent reflection due to the analog filter 32.

By suppressing the asymmetry of distortion components as described above, the pulse waveform can be made substantially line-symmetric with respect to the time axis, thereby preventing degradation of the signal characteristic.

If there are other factors that might cause asymmetry of distortion components, appropriate measures against those factors may be taken.

[5. Suppression of Reflected Wave]

[5.1 Suppression by Attenuator]

Figure 14:
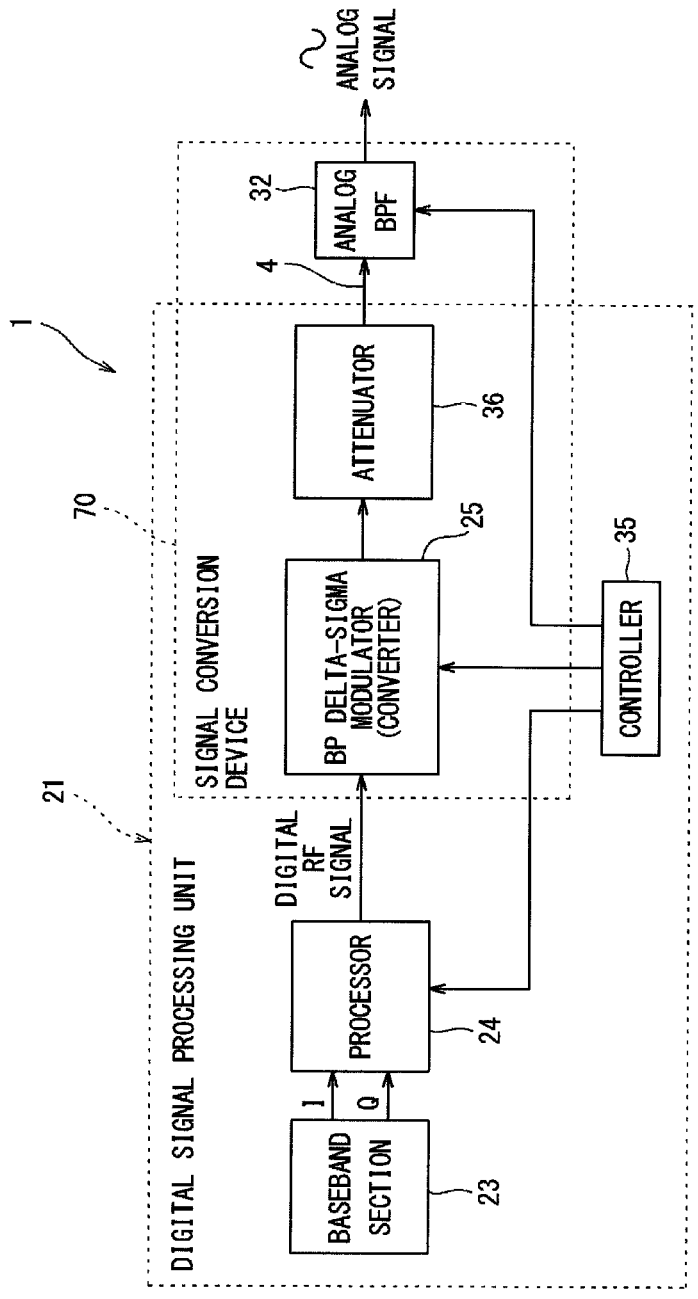
FIG. 14 is a block diagram showing a system according to a third embodiment.

FIG. 14 is a block diagram showing a system 1 according to a third embodiment.

The third embodiment is different from the first embodiment in that a controller 35 for controlling a processor 24, the delta-sigma modulator 25, and the analog filter 32 is provided, and an attenuator 36 is provided between the signal conversion unit 70 and the analog filter 32.

The processor 24, to which an IQ baseband signal output from the baseband section 23 is provided, performs processing such as digital quadrature modulation on the IQ baseband signal. Thus, from the processor 24, a signal in a digital signal format expressed by multi-bit digital data (discrete values) is output.

The modulation performed in the processor 24 is not limited to quadrature modulation, and may be another type of modulation for generating a modulated wave.

The processor 24 can perform various kinds of digital signal processing such as DPD (Digital Pre-distortion), CFR (Crest Factor Reduction), DUC (Digital Up Conversion), and the like in addition to quadrature modulation. From the processor 24, a digital RF signal generated through the various kinds of digital signal processing is output.

The controller 35 controls the processor 24 to convert the frequency of the digital RF signal to be output from the processor 24 to any desired frequency, and provide the digital RF signal to the delta-sigma modulator 25.

The delta-sigma modulator 25 performs delta-sigma modulation on the digital RF signal provided from the processor 24 to generate a 1-bit quantized signal (pulse signal). In the quantized signal generated by the delta-sigma modulator 25, quantization noise in the frequency band of the input RF signal is subjected to noise-shaping.

The band-pass delta-sigma modulator 25 is configured to change the quantization noise stop band (the center frequency of the band-pass delta-sigma modulator 25) in which quantization noise is subjected to noise-shaping.

The controller 35 controls the delta-sigma modulator 25 to adjust the quantization noise stop band. The controller 35 controls the band-pass delta-sigma modulator 25 such that the quantization noise stop band of the band-pass delta-sigma modulator 25 includes the frequency band of the RF signal (the signal band of the RF signal) to be input to the band-pass delta-sigma modulator 25.

In the delta-sigma modulator 25, the value of z can be changed based on the above formula (3). That is, the center frequency of the quantization noise stop band can be changed. In other words, the quantization noise stop band can be changed.

The controller 35 converts the value of z of the delta-sigma modulator 25 based on the above formula (3) in accordance with the center frequency (the carrier frequency $f_0$ described above) of the RF signal input to the delta-sigma modulator 25, thereby allowing band-pass delta-sigma modulation to be performed on the RF signal of the desired frequency.

As described above, by changing $\cos \theta_0$ (coefficient a) in the above conversion formula (3) according to the carrier frequency $f_0$ of the RF signal, band-pass delta-sigma modulation corresponding to the desired frequency $f_0$ can be performed without changing the sampling frequency fs. If $\cos \theta_0$ is changed, the coefficient of the NTF shown in formula (1) is changed, but the order of the formula is maintained. Thus, even if the configuration of the band-pass delta-sigma modulator 25 is changed in accordance with the carrier frequency $f_0$ of the RF signal, the complexity (order) of the formula is not changed, and therefore, signal processing load in the band-pass delta-sigma modulator 25 is not changed either.

As described above, in the present embodiment, advantageously, even if the carrier frequency $f_0$ is changed, signal processing load in the band-pass delta-sigma modulator 25 is not changed. In the present embodiment, the signal processing load in the band-pass delta-sigma modulator 25 depends on the sampling frequency fs determined based on the signal bandwidth, in accordance with the Nyquist's theorem. However, even if the carrier frequency $f_0$ is changed, the signal bandwidth is not changed, and thus, the sampling frequency fs need not be changed. When the delta-sigma modulator 25 is a low-pass type, in order to cope with a change of the carrier frequency $f_0$, the sampling frequency fs needs to be changed. In this point, a band-pass type is advantageous.

Further, use of formula (3) allows the delta-sigma modulator 25 to be used not only as a band-pass delta-sigma modulator corresponding to the desired frequency ($f_0$) but also as a low-pass delta-sigma modulator. That is, the delta-sigma modulator 25 can be switched between the low-pass type and the band-pass type.

Further, the controller 35 can control the passband of the analog filter 32 which is a filter for removing quantization noise included in the quantized signal to obtain a signal in the frequency band of the RF signal. More specifically, the controller 35 sets the center frequency of the analog filter 32 to the frequency of the RF signal which is set in the processor 24 and the delta-sigma modulator 25, thereby controlling the analog filter 32 such that the passband of the analog filter 32 is equal to the quantization noise stop band of the delta-sigma modulator 25.

Thereby, the analog filter 32 is set such that the passband thereof is equal to the frequency band of the RF signal represented by the quantized signal. The analog filter 32 can separate the signal within the frequency band of the RF signal in the quantized signal, and output the analog RF signal.

Information such as the frequency of the RF signal, which is needed by the controller 35 for setting of the respective sections, may be provided as desired according to external instructions, or may be previously stored in a storage unit or the like (not shown).

The controller 35 is also applicable to the systems 1 according to the first embodiment and the second embodiment.

As described above, the controller 35 controls and sets the frequency of the analog RF signal to be output from the system 1.

The attenuator 36 is provided on the signal transmission line 4 connecting the delta-sigma modulator 25 and the analog filter 32, and has a function to attenuate a signal transmitted through the signal transmission line 4.

When the delta-sigma modulator 25 outputs a quantized signal which is a 1-bit pulse train (1-bit pulse train signal), the quantized signal may be reflected at the analog filter 32 to cause a reflected wave.

That is, if impedance matching is not made between the signal transmission line 4 extending from the delta-sigma modulator 25 side and the analog filter 32, the quantized signal may cause a reflected wave. Since the quantized signal is a digital signal but has both digital and analog characteristics, it may cause a reflected wave if impedance matching is not made when the quantized signal is input to the analog filter 32.

As described above, when such unnecessary reflected wave is generated, the quantized signal is distorted due to influence of the reflected wave, which may cause asymmetry of distortion components.

In FIG. 14, the reflected wave is caused by the analog filter 32 for removing quantization noise. When the quantized signal reaches the analog filter 32 via the signal transmission line 4, a portion corresponding to the frequency band of the RF signal included in the quantized signal passes through the filter 32 because the passband of the analog filter 32 is adjusted to the frequency band of the RF signal, whereas a portion corresponding to quantization noise included in a band outside the passband is reflected by the analog filter 32 to be returned as a reflected wave to the delta-sigma modulator 25 as a signal source. That is, the analog filter 32 forms a reflection element that causes a reflected wave of the signal output from the delta-sigma modulator 25.

The reflected wave from the analog filter 32 is multiply reflected between the delta-sigma modulator 25 and the analog filter 32 through the signal transmission line 4.

The attenuator 36 can attenuate the reflected wave that is multiply reflected through the signal transmission line 4. Since the attenuator 36 is provided on the signal transmission line 4, the attenuator 36 also attenuates the quantized signal. However, since the reflected wave is multiply reflected, the number of times the reflected wave passes the attenuator 36 is larger than the number of times the quantized signal passes the attenuator 36. As a result, the reflected wave is more attenuated than the quantized signal, and thus influence of the reflected wave on the quantized signal can be reduced.

According to the present embodiment, since the signal reflection from the analog filter 32 to the delta-sigma modulator 25, which is a factor causing asymmetry, can be suppressed by the attenuator 36, degradation of the signal characteristic of the quantized signal can be prevented.

Thus, the attenuator 36 constitutes a suppression section that suppresses the reflected wave of the signal output from the delta-sigma modulator 25.

In the present embodiment, the analog filter 32 is provided as a reflection element that causes a reflected wave of the signal output from the delta-sigma modulator 25. However, the reflection element is not limited to the analog filter 32, and may be an element, such as an antenna, having a predetermined impedance which causes a reflected wave of the signal output from the delta-sigma modulator 25.

Hereinafter, a test executed by the present inventor to verify the effect of suppressing a reflected wave by the above attenuator will be described.

Figure 15A:
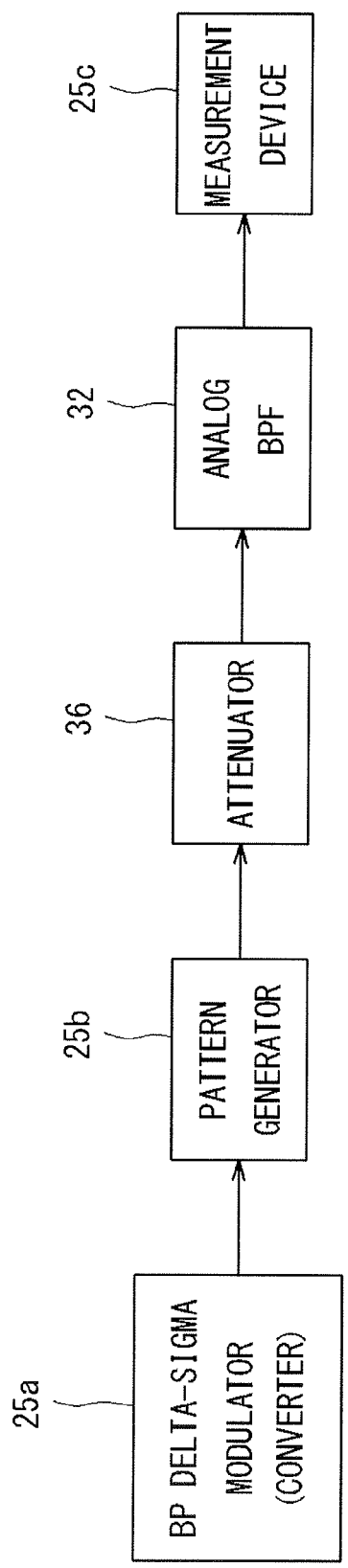
FIG. 15A is a block diagram showing devices used for verification of the effect of suppressing a reflected wave by an attenuator and shows a configuration simulating an actual system.
Figure 15B:
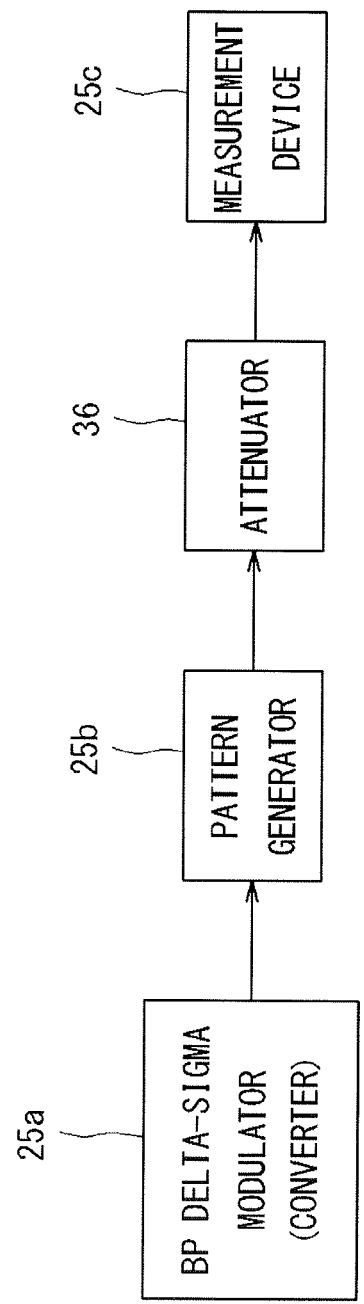
FIG. 15B shows a configuration for referring to power when an analog filter that causes a reflected wave is omitted.

FIG. 15 is a block diagram showing devices used for verifying the effect of suppressing a reflected wave by the attenuator. FIG. 15A shows a configuration that simulates an actual system, and FIG. 15B shows a configuration for referring to power when the analog filter 32 that causes a reflected wave is omitted.

The device (hereinafter referred to as "device A") shown in FIG. 15A includes a band-pass delta-sigma modulator 25a configured by software, and a pulse pattern generator 25b, like in FIG. 5. The pulse pattern generator 25b is connected to a stage subsequent to the delta-sigma modulator 25, and appropriately adjusts the signal waveform of the quantized signal output from the delta-sigma modulator 25.

The device A further includes an attenuator 36 to which the adjusted quantized signal output from the pulse pattern generator 25b is input, an analog filter 32, and a measurement device 25c.

The device (hereinafter referred to as "device B") shown in FIG. 15B is identical to the device A except that the analog filter 32 is omitted.

Using the devices A and B, a pseudo quantized signal was provided to the attenuator 36, and the relationship between an adjustment value of the attenuator 36 and output power of the quantized signal was verified.

Figure 16A:
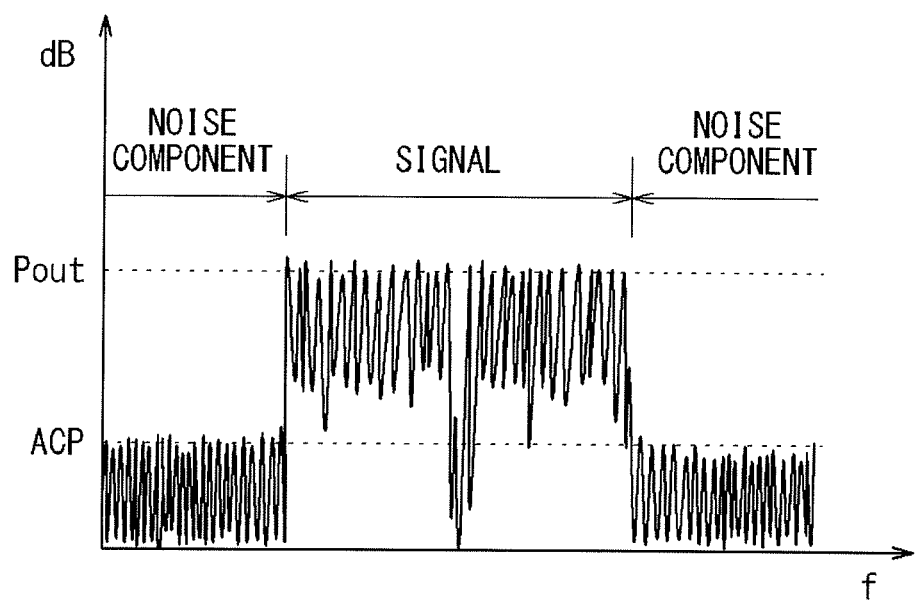
FIG. 16A is a diagram showing an example of measurement results obtained by a measurement device in a verification test.

FIG. 16A is a diagram showing an example of a measurement result obtained by the measurement device 25c in the verification test. In FIG. 16A, the vertical axis indicates the power, and the horizontal axis indicates the frequency, namely, the frequency spectrum around the passband of the analog filter 32. As shown in FIG. 16A, a signal component having a power higher than powers of neighboring noise components is included with a predetermined bandwidth in the passband of the analog filter 32 through which the quantized signal has passed.

In this test, using the device A, a power Pout of the signal component and a power ACP (Adjacent Channel Power) of adjacent bands adjacent to the band of the signal component were measured, and changes of these powers with respect to an adjustment value of the attenuator 36 were verified. Further, the device B was used to measure an ACP in the case where there is no influence of a reflected wave, and a Pout and an ACP thereof were measured.

Figure 16B:
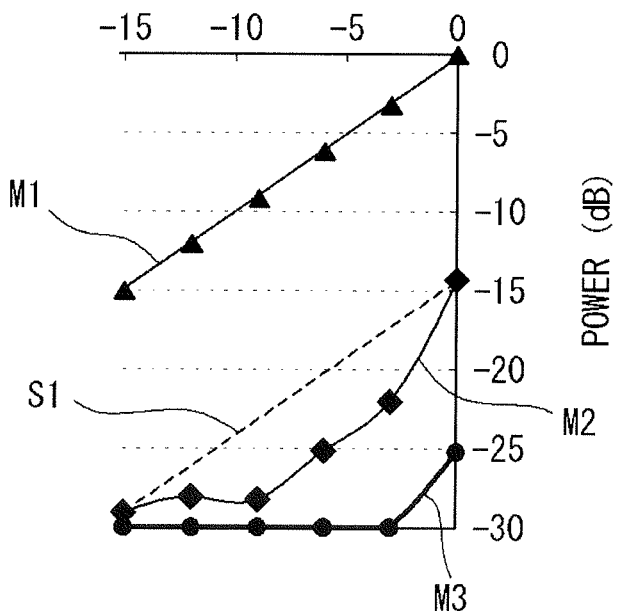
FIG. 16B is a graph showing variation of power with respect to an adjustment value of the attenuator.

FIG. 16B is a graph showing changes of the powers with respect to the adjustment value of the attenuator 36. In FIG. 16B, the horizontal axis indicates the adjustment value of the attenuator 36. The larger the adjustment value is, the smaller the set attenuation amount is. The vertical axis indicates the values of the measured powers.

In FIG. 16B, a line M1 indicates the measurement result of the Pout. As shown in FIG. 16B, the Pout is in a linear relation with the adjustment value of the attenuator 36. It was confirmed that, for the Pout, almost the same measurement results were obtained in both cases of using the devices A and B.

A line M2 indicates the measurement result of the ACP obtained by using the device A, and a line M3 indicates the measurement result of ACP obtained by using the device B. In FIG. 16B, the power values equal to and lower than −30 dB are outside the measurable range of the measurement device 25c. Therefore, a portion of the line M3 indicating the power value of −30 dB actually has the power values equal to and lower than −30 dB.

In the device B, since the attenuator 36 and the measurement device 25c are directly connected to the pulse pattern generator 25b without an intervening analog filter 32, almost no reflected wave of the quantized signal occurs. Therefore, influence of a reflected wave is not included in the line M3.

The line M2 indicates relatively large values over the entire region measured, as compared to the line M3 including no influence of a reflected wave. In this regard, it is confirmed that the ACP indicated by the line M2 includes influence of a reflected wave caused by the analog filter 32, whereby ACPR (Adjacent Channel Power Ratio: a value obtained by dividing Pout by ACP) is reduced, and the signal quality is degraded as compared to the case where the analog filter 32 is absent.

The line M2 indicates the power value lower than a straight line S1 which passes a point, in the line M2, where the adjustment value of the attenuator 36 is 0, and is parallel to the Pout, and the amount of attenuation is relatively large as compared to the Pout with the same adjustment value of the attenuator 36.

If no influence of a reflected wave is included in the value of ACP of the device A, it is considered that the line M2 will be parallel to the straight line S1 and the line M1, and the ACP will be in a linear relation with the adjustment value of the attenuator 36. However, the line M2 representing the measurement result of the ACP of the device A actually indicates the power value smaller than the straight line S1, and the attenuation amount is relatively large as compared to the Pout with the same adjustment amount of the attenuator 36. In this regard, it is found that a reflected wave caused by the analog filter 32 is attenuated by the attenuator 36 greatly relative to the signal wave. Thus, the device A including the attenuator 36 can increase the ACRP because the reflected wave is suppressed, resulting in improved signal quality.

As described above, it is confirmed that the reflected light is suppressed and influence of the reflected light is reduced by providing the attenuator 36.

[5.2 Suppression by Filter]

Figure 17:
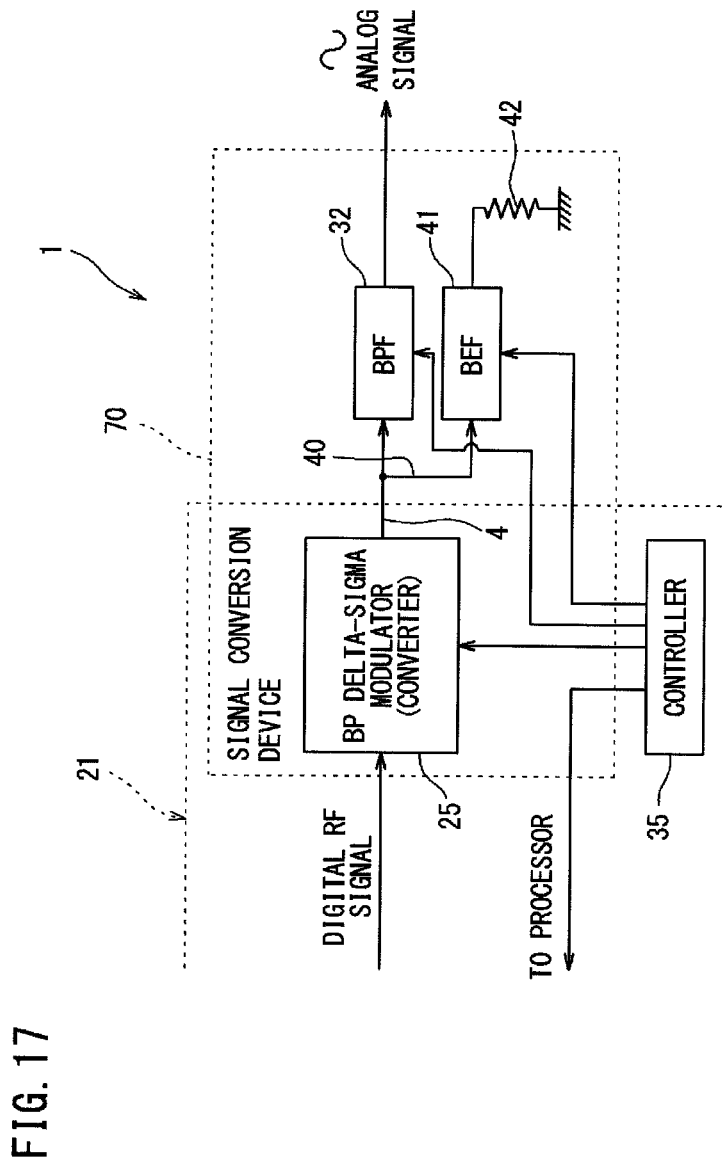
FIG. 17 is a block diagram showing a major part of a system according to a fourth embodiment.

FIG. 17 is a block diagram showing a major part of a system 1 according to a fourth embodiment.

The fourth embodiment is different from the third embodiment in that a branching path 40 is provided instead of the attenuator 36.

The branching path 40 is connected between the delta-sigma modulator 25 and the analog filter 32 (reflection element). The branching path 40 includes an analog band elimination filter 41, and a terminator 42. The analog band elimination filter 41 blocks passing of a signal within the passband of the analog filter 32, and allows passing of a signal outside the passband. The terminator 42 terminates the signal outside the passband, which has passed through the band elimination filter 41.

Like the analog filter 32, the band elimination filter 41 is also controlled by the controller 35. The controller 35 can adjustably control the block band of the band elimination filter 41.

The band elimination filter 41 is controlled by the controller 35 such that the block band thereof is equal to the passband of the analog filter 32.

The analog filter 32 allows, in the quantized signal, the signal within the frequency band of the RF signal to pass therethrough, thereby separating the analog RF signal.

On the other hand, the band elimination filter 41 blocks passing of a signal within the passband of the analog filter 32, and allows passing of a signal outside the passband. Thus, quantization noise included in a band outside the frequency band of the RF signal, which can be reflected by the analog filter 32, is not reflected but is guided to the branching path 40 connected to the band elimination filter 41.

The terminator 42 provided at a stage subsequent to the band elimination filter 41 is set to a resistance value that allows impedance matching with the signal transmission line 4 extending from the delta-sigma modulator 25. Thus, the branching path 40 can achieve impedance matching with the signal transmission line 4.

Therefore, in the present embodiment, in the quantized signal output from the delta-sigma modulator 25, the signal within the frequency band of the RF signal is guided to the analog filter 32, while the quantization noise or the like, which is a signal outside the frequency band of the RF signal, is not reflected but is guided to the branching path 40 through the band elimination filter 41. Since the terminator 42 is provided at the end of the branching path 40, the signal outside the frequency band of the RF signal, which is guided to the branching path 40 side, is terminated by the terminator 42.

As a result, since the signal outside the frequency band of the RF signal, which may cause a reflected wave, is guided to the branching path 40 side and terminated, it is possible to suppress unnecessary reflection while obtaining the RF signal.

As described above, the branching path 40 has a function as a suppression section to suppress a reflected wave of a signal output from the delta-sigma modulator 25.

In the above embodiments, the analog filter 32 which is a band-pass filter is used as an analog filter for separating a signal within the frequency band of an RF signal, and the band elimination filter 41 is used as a filter on the branching path 40 side. However, any filters may be used as long as the filters are capable of separating, from a quantized signal, an RF signal and signals other than the RF signal, and guiding the separated signals individually. Therefore, a low-pass filter may be used instead of the analog filter 32 which is a band-pass filter. Whether a band-pass filter or a low-pass filter is used is appropriately determined based on the frequency of the RF signal.

When the signal conversion device 70 performs signal conversion according to band-pass delta-sigma modulation, as shown in FIG. 17, the analog band-pass filter 32 is used as an analog filter for separating an RF signal, and the band elimination filter 41 is used as a filter provided on the branching path 40 side.

Figure 18:
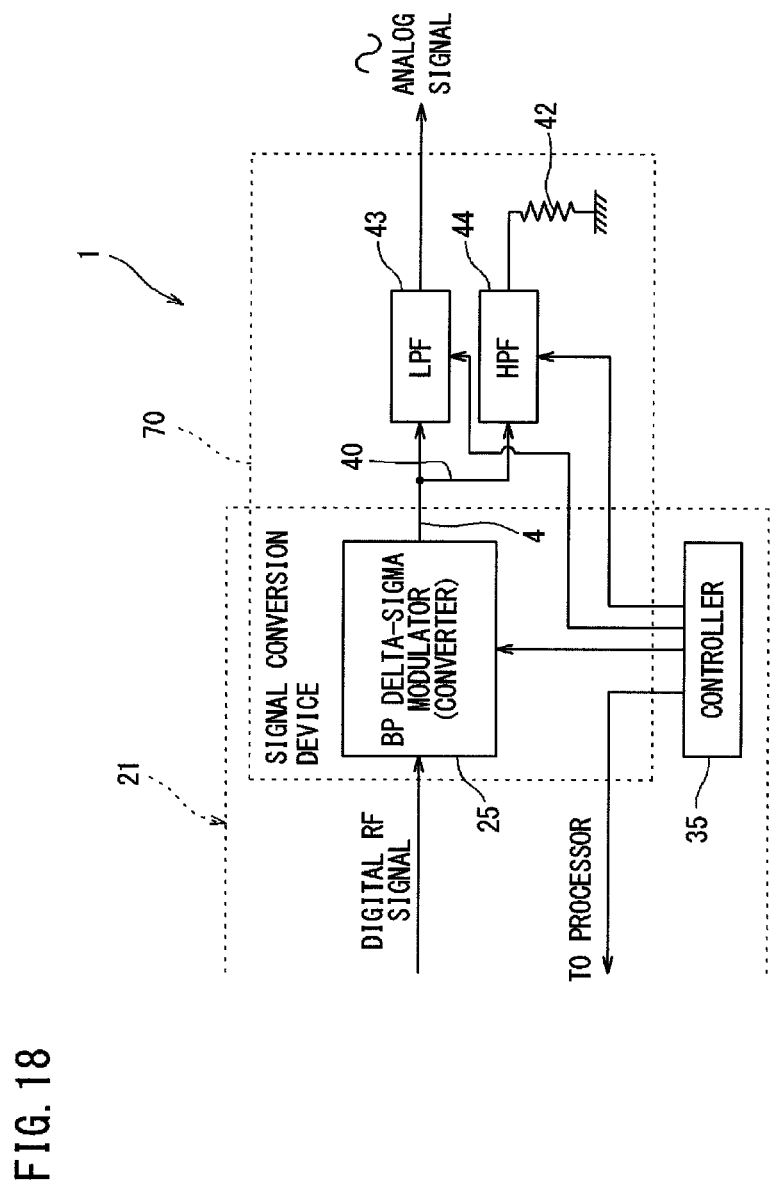
FIG. 18 is a block diagram showing a major part of a system according to a modification of the fourth embodiment.

When the signal conversion device 70 performs signal conversion according to low-pass delta-sigma modulation, as shown in FIG. 18, a low-pass filter 43 is used as an analog filter for separating an RF signal, and a high-pass filter 44 is used as a filter on the branching path 40 side.

Figure 19:
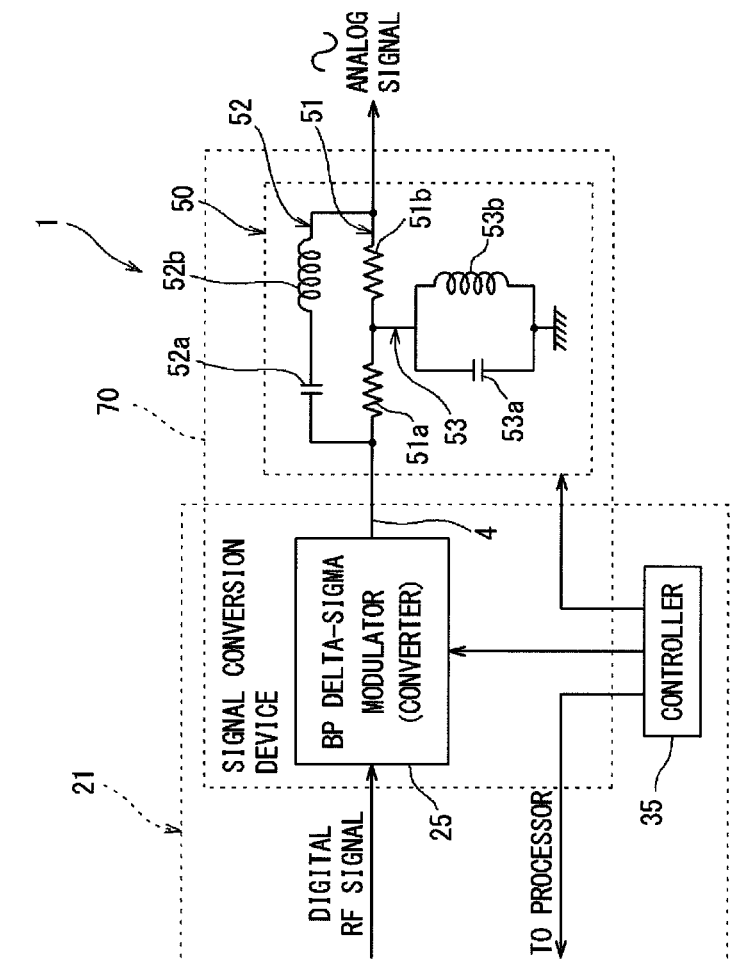
FIG. 19 is a block diagram showing a major part of a system according to a fifth embodiment.

FIG. 19 is a block diagram showing a major part of a system 1 according to a fifth embodiment.

The fifth embodiment is different from the fourth embodiment in that a filter circuit 50 is provided instead of the analog filter 32 and the branching path 40.

The filter circuit 50 forms a bridged-T band-pass filter, and a passband thereof is set to a frequency band of an RF signal represented by a quantized signal. That is, the filter circuit 50 has a function as the analog filter 32 of the above embodiments.

In addition, the filter circuit 50 of the present embodiment has a function as a suppression section. The filter circuit 50 includes: a first path 51 connected to the signal transmission line 4 and having a resistor 51a and a resistor 51b connected in series; a second path 52 branching from a stage preceding the resistor 51a and connected to a stage subsequent to the resistor 51b so as to bypass the resistors 51a and 51b; and a third path 53 through which a midpoint between the resistor 51a and the resistor 51b is grounded.

The resistors 51a and 51b are each set to a resistance value that achieves impedance matching with the signal transmission line 4.

In the second path 52, a capacitor 52a and an inductor 52b are connected in series. In the third path 53, a capacitor 53a and an inductor 53b are connected in parallel.

The capacitor 52a, the inductor 52b, the capacitor 53a, and the inductor 53b satisfy the relationships of the following equations:

capacitance of the capacitor 52a $Cs=1/(Q\omega_0 Z_0)$ inductance of the inductor 52b $Ls=(QZ_0)/\omega_0$ capacitance of the capacitor 53a $Cp=Q/(\omega_0 Z_0)$ inductance of the inductor 53b $Lp=Z_0/(Q\omega_0)$ where $Z_0$ is an impedance, $\omega_0$ is a center angle frequency, and Q is a constant.

When the filter circuit 50 is resonated, the impedance of the second path 52 in which the capacitor 52a and the inductor 52b form series resonance is low, and a signal passes through the second path 52. At this time, since the impedance of the third path 53 is high because the capacitor 53a and the inductor 53b form parallel resonance, the signal is not transmitted to the ground side. Thus, the filter circuit 50 allows a signal that can resonate the filter circuit 50 to pass through the second path 52.

On the other hand, when the filter circuit 50 is not resonated, the impedance of the second path 52 is high and the impedance of the third path 53 is low. Therefore, the signal is transmitted to the ground side through the third path 53. That is, the signal is terminated by the resistor 51a set at the value that achieves impedance matching with the signal transmission line 4.

As described above, the filter circuit 50 forms a band-pass filter which allows a signal of a frequency band that can resonate the filter circuit 50 to pass therethrough, and terminates signals outside the frequency band.

The passband of the filter circuit 50 can be controlled by the controller 35, and is set to the frequency band of the RF signal. Since the filter circuit 50 terminates signals outside the passband as described above, it is possible to suppress unnecessary signal reflection due to signals such as quantization noise and the like included in the band outside the frequency band of the RF signal.

As described above, the filter circuit 50 has both a function as an analog filter (reflection element) having a predetermined signal band as a passband, and a function as a suppression section that suppresses a reflected wave of a signal output from the delta-sigma modulator 25. That is, the suppression section and the reflection element form the filter circuit 50.

While in the above embodiment, the filter circuit 50 configured as a bridged-T band-pass filter is used, filter circuits that configure a constant-K filter, a derived M-type filter, and the like may be used, for example. These filters, like the bridged-T filter, can make impedance matching with the signal transmission line 4 not only for the passband but also for outside the passband, and thus unnecessary signal reflection due to signals included in a band outside the passband can be suppressed.

Figure 20:
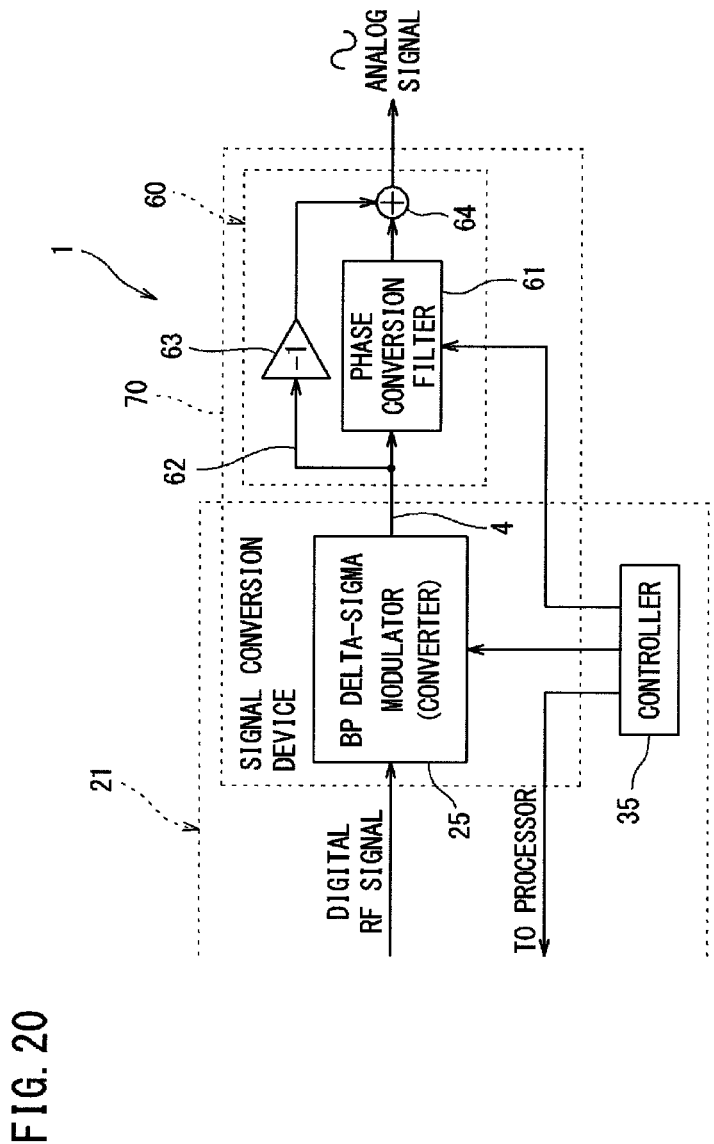
FIG. 20 is a block diagram showing a major part of a system according to a sixth embodiment.

FIG. 20 is a block diagram showing a major part of a system 1 according to a sixth embodiment. The sixth embodiment is different from the fifth embodiment in that a filter circuit 60 including a phase conversion filter is provided instead of the filter circuit 50.

The filter circuit 60 of the present embodiment also has both a function as an analog filter (reflection element) and a function as a suppression section, and is composed of a suppression section and a reflection element. The filter circuit 60 includes a phase conversion filter 61 connected to a signal transmission line 4, an inverting amplifier 63 connected to a branching path 62 branching from a stage preceding the phase conversion filter 61, and a synthesizer 64 that synthesizes an output of the phase conversion filter 61 with an output of the inverting amplifier 63.

The phase conversion filter 61 of the present embodiment is a filter set so as to have a transfer function H(s, ω, Q) expressed by the following formula (G), and is an all-pass filter having no frequency dependence, and a pass gain of 1. When the phase conversion filter 61 allows an input signal to pass therethrough, the phase conversion filter 61 converts a predetermined frequency band into a signal having a phase difference of 180 degrees and allows the signal to pass therethrough, and allows signals outside the frequency band as signals in phase.

[Math. 11]

$$H(s, \omega, Q) = \frac{s^2 - \frac{\omega_r}{Q}s + \omega_r^2}{s^2 + \frac{\omega_r}{Q}s + \omega_r^2} \tag{G}$$

In formula (G), s (=jω) is a complex frequency, $\omega_r$ is an angle frequency to be phase-inverted, and Q is a quality factor of the filter.

Figure 21A:
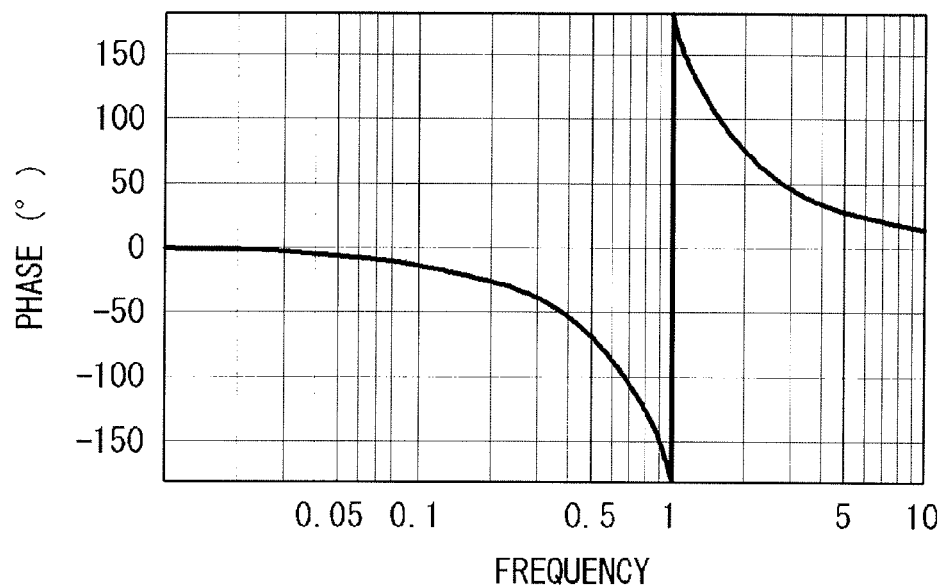
FIG. 21A is a graph showing characteristic of phase change with respect to a frequency of an input signal in a phase conversion filter.

FIG. 21A is a graph showing the characteristic of phase change with respect to the frequency of the input signal in the phase conversion filter 61. In FIG. 21A, the horizontal axis indicates the frequency and the vertical axis indicates the phase.

As shown in FIG. 21A, for example, if the predetermined frequency to be phase-inverted is "1" on the horizontal axis, the phase of the phase conversion filter 61 is 0 degree at the frequency of "1", and thus a phase difference of 180 degrees can be provided between the inside and the outside of the frequency band with the frequency of "1" as a boundary frequency.

Figure 21B:
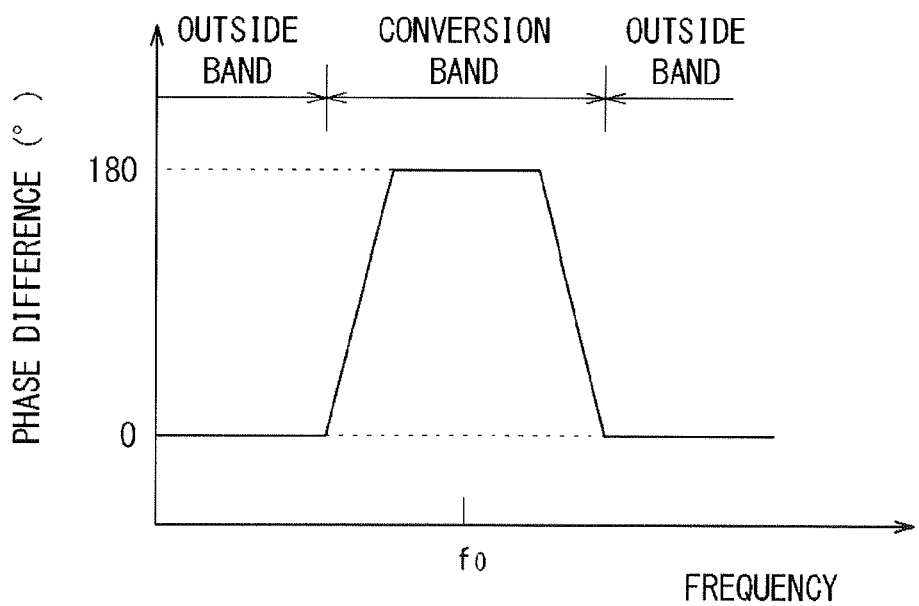
FIG. 21B is a graph showing an example of phase conversion of a quantized signal by using the phase conversion filter.

FIG. 21B is a graph showing an example of a quantized signal that is phase-converted by using the phase conversion filter 61. In FIG. 21B, the phase conversion filter 61 converts, in the input quantized signal, a signal within a conversion band determined by the center frequency $f_0$ into a signal having a phase difference of 180 degrees and allows the signal to pass therethrough, and allows signals outside the conversion band to pass therethrough in phase.

The conversion band (predetei mined signal band) of the phase conversion filter 61 can be adjusted. The phase conversion filter 61 is controlled by the controller 35, and the conversion band of the phase conversion filter 61 is controlled by the controller 35 so as to include the frequency band of the RF signal.

Therefore, in the quantized signal output from the phase conversion filter 61 toward the synthesizer 64, a signal in a band outside the conversion band is in phase with the original signal, while a signal in the conversion band including the frequency band of the RF signal has a phase difference of 180 degrees with respect to the original signal.

Referring back to FIG. 20, the inverting amplifier 63 inverts the phase of the quantized signal obtained from a stage preceding the phase conversion filter 61, and provides the inverted signal of the quantized signal to the synthesizer 64.

In this way, the phase conversion filter 61 and the inverting amplifier 63 form a generator that generates, from the output of the delta-sigma modulator 25, a phase-converted quantized signal (first signal) and an inverted signal (second signal) of the quantized signal.

The synthesizer 64 synthesizes the phase-converted quantized signal output from the phase conversion filter 61 with the inverted signal of the quantized signal, which is output from the inverting amplifier 63.

At this time, in the quantized signal phase-converted by the phase conversion filter 61, the signal in the conversion band has a phase difference of 180 degrees with respect to the original signal. Therefore, the signal in the conversion band is in phase with the inverted signal of the quantized signal, which is output from the inverting amplifier 63. Accordingly, the signal within the frequency band of the RF signal included in the conversion band is synthesized in phase with the inverted signal of the quantized signal.

On the other hand, in the quantized signal phase-converted by the phase conversion filter 61, the signal in the band outside the conversion band is in phase with the original signal. Therefore, the signal in the band outside the conversion band is opposite in phase, with a phase difference of 180 degrees, to the inverted signal of the quantized signal, which is output from the inverting amplifier 63. Accordingly, the signal in the band outside the conversion band is canceled out by the inverted signal of the quantized signal.

The synthesizer 64 synthesizes the quantized signal output from the phase conversion filter 61 with the quantized signal output from the inverting amplifier 63, thereby canceling out the signals in the band outside the conversion band, and outputting the in-phase-synthesized signal within the frequency band of the RF signal.

According to the above configuration, the quantized signal phase-converted by the phase conversion filter 61 and the inverted signal of the quantized signal, which is output from the inverting amplifier 63, are set at phases such that, when these signals are synthesized with each other, signals (signal components) within the frequency band of the RF signal, which are respectively included in the quantized signal and the inverted signal, can be prevented from being canceled out, while signals (signal components) outside the frequency band of the RF signal, which are respectively included in the quantized signal and the inverted signal, can be canceled out.

As a result, the signals outside the frequency band of the RF signal, which may cause a reflected wave, can be canceled out without being reflected. As a result, it is possible to suppress signal reflection while obtaining an in-phase-synthesized signal within the frequency band of the RF signal.

In the above embodiment, the phase conversion filter 61 and the inverting amplifier 63 serving as the generator generates, from the quantized signal output from the delta-sigma modulator 25, the phase-converted quantized signal (first signal), and the inverted signal (second signal) of the quantized signal. However, for example, by providing the inverting amplifier 63 at a stage preceding or subsequent to the phase conversion filter 61, the synthesizer 64 may be configured to synthesize the inverted signal (first signal) of the quantized signal phase-converted by the phase conversion filter 61 and the quantized signal (second signal) output from the delta-sigma modulator 25. Also in this case, signals outside the frequency band of the RF signal, which may cause a reflected wave, can be canceled out, and thus signal reflection can be suppressed.

As described above, the phase conversion filter 61 and the inverting amplifier 63 serving as the generator generates, from the quantized signal output from the delta-sigma modulator 25, an inverted signal opposite in phase to the quantized signal, and further generates, from one of the quantized signal and the inverted signal, a signal in which a portion thereof within the signal band of the RF signal is opposite in phase to the one signal and a portion thereof outside the signal band is in phase with the one signal, as a first signal, and the other one of the quantized signal and the inverted signal as a second signal.

In the above embodiment, the quantized signal phase-converted by the phase conversion filter 61 is synthesized with the inverted signal of the quantized signal, which is obtained by the inverting amplifier 63. However, when the digital signal processing unit 21 generates a quantized signal as a differential signal as shown in FIG. 22, the differential signal may be used for the synthesis.

Figure 23:
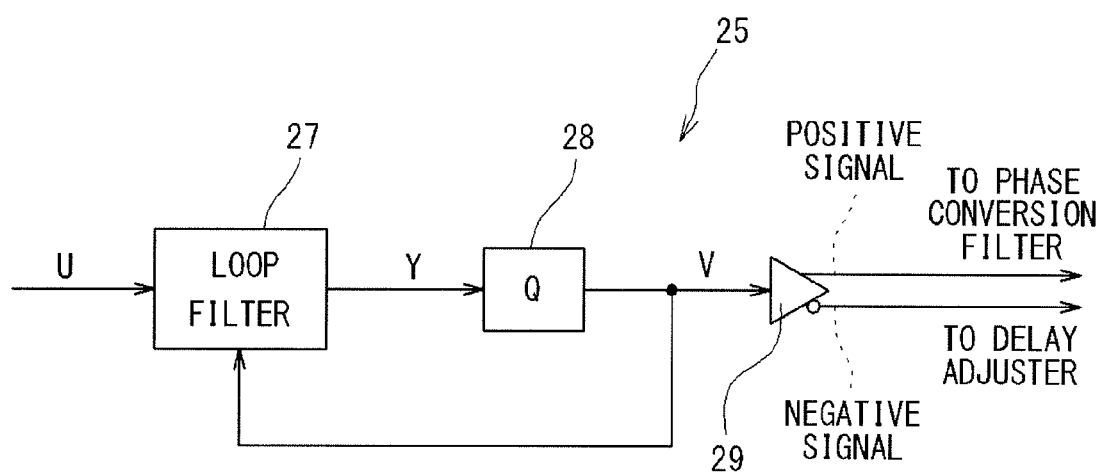
FIG. 23 is a block diagram showing a pulse converter included in the delta-sigma modulator.

FIG. 23 is a block diagram showing a pulse converter included in the delta-sigma modulator 25. As shown in FIG. 23, the delta-sigma modulator 25 includes a pulse converter 29 for performing pulse conversion on an output V of the quantizer 28. The pulse converter 29 generates, as a quantized signal, a differential signal composed of a positive signal and a negative signal.

In the differential signal, the positive signal is provided to the phase conversion filter 61, and the negative signal is provided to a delay adjuster 66 (refer to FIG. 22) that adjusts signal delay. The positive signal and the negative signal are opposite in phase. Therefore, by synthesizing the positive signal phase-converted by the phase conversion filter 61 with the negative signal, signals outside the frequency band of the RF signal, which may cause a reflected wave, can be canceled out, and thus signal reflection can be suppressed.

Figure 22:
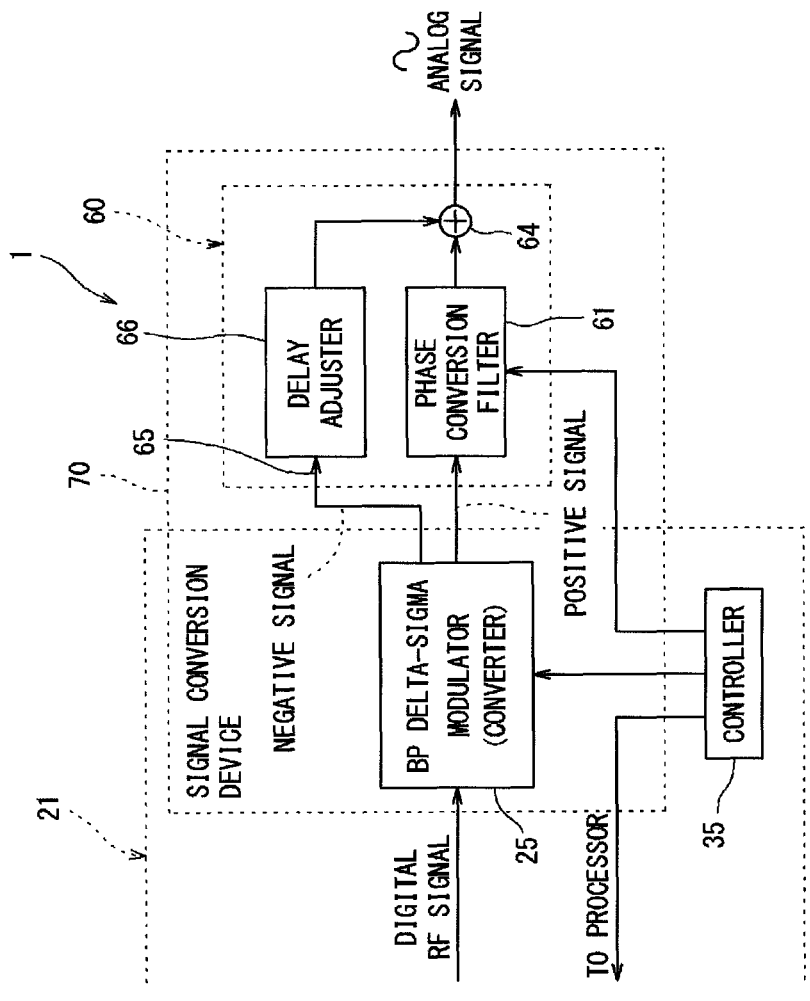
FIG. 22 is a block diagram showing a major part of a system according to a modification of the sixth embodiment.

While in FIG. 22 and FIG. 23 the positive signal is provided to the phase conversion filter 61, the negative signal may be provided to the phase conversion filter 61 while the positive signal may be provided to the delay adjuster 66.

[6. Additional Notes]

The embodiments disclosed are to be considered in all respects as illustrative and not restrictive. The scope of the invention is indicated by the appended claims rather than by the foregoing meaning, and all changes which come within the meaning and range of equivalency of the claims are therefore intended to be embraced therein.

REFERENCE SIGNS LIST 1 system
25 delta-sigma modulator (converter)
32 analog filter
35 controller
36 attenuator 40 branching path
41 band elimination filter
42 terminator
50 filter circuit
60 filter circuit
61 phase conversion filter
63 inverting amplifier
64 synthesizer
70 signal conversion device
71 coding section
72 terminator

The invention claimed is:

1. A signal conversion method, comprising:
converting an input signal into a 1-bit pulse train that represents an analog signal, the input signal being an RF signal, wherein
the 1-bit pulse train has a pulse rising waveform and a pulse falling waveform, the pulse rising waveform including a first distortion component with respect to an ideal pulse rising waveform, and the pulse falling waveform including a second distortion component with respect to an ideal pulse falling waveform;
the signal conversion method further comprising;
reducing a leakage power outside the frequency band of the RF signal represented in the 1-bit pulse train by suppressing line-asymmetry of the first distortion component and the second distortion component.

2. The signal conversion method according to claim 1, wherein
the line-asymmetry of the first distortion component and the second distortion component is caused by a factor inside a converter that converts an input signal into a 1-bit pulse train representing an analog signal.

3. The signal conversion method according to claim 1, wherein
the line-asymmetry of the first distortion component and the second distortion component is caused by a factor outside a converter that converts an input signal into a 1-bit pulse train representing an analog signal.

4. The signal conversion method according to claim 1, wherein
the input signal is input to a converter that performs delta-sigma modulation, and
the 1-bit pulse train is output from the converter.

5. A signal transmission method, comprising:
transmitting the 1-bit pulse train obtained in the signal conversion method according to claim 1 to a signal transmission line.

6. A signal conversion device, comprising:
a converter configured to convert an input signal into a 1-bit pulse train representing an analog signal, the input signal being an RF signal, wherein
the 1-bit pulse train has a pulse rising waveform and a pulse falling waveform, the pulse rising waveform including a first distortion component with respect to an ideal pulse rising waveform, and the pulse falling waveform including a second distortion component with respect to an ideal pulse falling waveform;
the signal conversion device further comprising;
a reduction part configured to reduce a leakage power outside the frequency band of the RF signal represented in the 1-bit pulse train by suppressing line-asymmetry of the first distortion component and the second distortion component.

* * * * *